(12) United States Patent
Cha et al.

(10) Patent No.: US 11,269,723 B2
(45) Date of Patent: Mar. 8, 2022

(54) MEMORY CONTROLLER AND MEMORY SYSTEM INCLUDING THE SAME

(71) Applicant: SAMSUNG ELECTRONICS CO., LTD., Suwon-si (KR)

(72) Inventors: Sanguhn Cha, Suwon-si (KR); Kijun Lee, Seoul (KR); Myungkyu Lee, Seoul (KR); Sunghye Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/988,931

(22) Filed: Aug. 10, 2020

(65) Prior Publication Data
US 2021/0208967 A1 Jul. 8, 2021

(30) Foreign Application Priority Data
Jan. 7, 2020 (KR) .................. 10-2020-0002203

(51) Int. Cl.
*G06F 11/10* (2006.01)
*H03M 13/11* (2006.01)
*G06F 11/07* (2006.01)
*H03M 13/15* (2006.01)

(52) U.S. Cl.
CPC ...... *G06F 11/1068* (2013.01); *G06F 11/0772* (2013.01); *G06F 11/106* (2013.01); *G06F 11/1044* (2013.01); *H03M 13/1105* (2013.01); *H03M 13/1575* (2013.01)

(58) Field of Classification Search
CPC ............... G06F 11/1068; G06F 11/106; G06F 11/1044; G06F 11/0772; H03M 13/1575; H03M 13/1105
See application file for complete search history.

(56) References Cited

U.S. PATENT DOCUMENTS

| | | |
|---|---|---|
| 7,849,381 B2 | 12/2010 | Tomlin |
| 8,495,467 B1 | 7/2013 | Billing et al. |
| 9,811,420 B2 | 11/2017 | Das et al. |
| 10,061,642 B2 | 8/2018 | Baek et al. |
| 10,169,126 B2 | 1/2019 | Lim et al. |
| 10,268,541 B2 | 4/2019 | Niu et al. |
| 10,404,286 B2 | 9/2019 | Sin et al. |

(Continued)

*Primary Examiner* — Thien Nguyen
(74) *Attorney, Agent, or Firm* — F. Chau & Associates, LLC

(57) ABSTRACT

A memory controller controls a memory module including data chips and first and second parity chips. The memory controller includes an error correction code (ECC) engine. The ECC engine includes an ECC decoder and a memory to store a parity check matrix. The ECC decoder receives error information signals associated with the data chips, performs an ECC decoding on a codeword set from the memory module using the parity check matrix to generate a first syndrome and a second syndrome, and corrects bit errors in a user data set based on the error information signals and the second syndrome. The bit errors are generated by a row fault and uncorrectable using the first syndrome and the second syndrome. Each of the error information signals includes row fault information indicating whether the row fault occurs in at least one of memory cell rows in corresponding one of the data chips.

20 Claims, 22 Drawing Sheets

(56) References Cited

U.S. PATENT DOCUMENTS

| | | | |
|---|---|---|---|
| 2011/0154157 A1* | 6/2011 | Naeimi | H03M 13/2906 |
| | | | 714/758 |
| 2015/0007001 A1* | 1/2015 | Kern | H03M 13/616 |
| | | | 714/785 |
| 2015/0199234 A1 | 7/2015 | Choi et al. | |
| 2018/0060165 A1* | 3/2018 | Kim | G06F 11/1048 |
| 2019/0042358 A1 | 2/2019 | Criss et al. | |
| 2019/0179704 A1 | 6/2019 | Niu et al. | |
| 2019/0220341 A1 | 7/2019 | Shim | |

* cited by examiner

FIG. 8

OSMb

ZSM

ISM

|   | | | | | | | | | | | | | | | | |
|---|---|---|---|---|---|---|---|---|---|---|---|---|---|---|---|---|
|   | 1 | 0 | 0 | 0 | 0 | 0 | 0 | 0 | 0 | 0 | 0 | 0 | 0 | 0 | 0 | 0 |
|   | 0 | 1 | 0 | 0 | 0 | 0 | 0 | 0 | 0 | 0 | 0 | 0 | 0 | 0 | 0 | 0 |
|   | 0 | 0 | 1 | 0 | 0 | 0 | 0 | 0 | 0 | 0 | 0 | 0 | 0 | 0 | 0 | 0 |
|   | 0 | 0 | 0 | 1 | 0 | 0 | 0 | 0 | 0 | 0 | 0 | 0 | 0 | 0 | 0 | 0 |
|   | 0 | 0 | 0 | 0 | 1 | 0 | 0 | 0 | 0 | 0 | 0 | 0 | 0 | 0 | 0 | 0 |
|   | 0 | 0 | 0 | 0 | 0 | 1 | 0 | 0 | 0 | 0 | 0 | 0 | 0 | 0 | 0 | 0 |
|   | 0 | 0 | 0 | 0 | 0 | 0 | 1 | 0 | 0 | 0 | 0 | 0 | 0 | 0 | 0 | 0 |
| p | 0 | 0 | 0 | 0 | 0 | 0 | 0 | 1 | 0 | 0 | 0 | 0 | 0 | 0 | 0 | 0 |
|   | 0 | 0 | 0 | 0 | 0 | 0 | 0 | 0 | 1 | 0 | 0 | 0 | 0 | 0 | 0 | 0 |
|   | 0 | 0 | 0 | 0 | 0 | 0 | 0 | 0 | 0 | 1 | 0 | 0 | 0 | 0 | 0 | 0 |
|   | 0 | 0 | 0 | 0 | 0 | 0 | 0 | 0 | 0 | 0 | 1 | 0 | 0 | 0 | 0 | 0 |
|   | 0 | 0 | 0 | 0 | 0 | 0 | 0 | 0 | 0 | 0 | 0 | 1 | 0 | 0 | 0 | 0 |
|   | 0 | 0 | 0 | 0 | 0 | 0 | 0 | 0 | 0 | 0 | 0 | 0 | 1 | 0 | 0 | 0 |
|   | 0 | 0 | 0 | 0 | 0 | 0 | 0 | 0 | 0 | 0 | 0 | 0 | 0 | 1 | 0 | 0 |
|   | 0 | 0 | 0 | 0 | 0 | 0 | 0 | 0 | 0 | 0 | 0 | 0 | 0 | 0 | 1 | 0 |
|   | 0 | 0 | 0 | 0 | 0 | 0 | 0 | 0 | 0 | 0 | 0 | 0 | 0 | 0 | 0 | 1 | p

580

| | ADDINF (BGA,BA,RA) | ECNT | FCWCNT | RFF |
|---|---|---|---|---|
| Idx1 | A | 2 | 2 | 0 |
| Idx2 | B | 4 | 3 | 1 |
| ⋮ | ⋮ | ⋮ | ⋮ | ⋮ |
| Idxu | X | 1 | 1 | 0 |
| | 581 | 582 | 583 | 584 |

MEMORY CONTROLLER AND MEMORY SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2020-0002203, filed on Jan. 7, 2020, the disclosure of which is incorporated by reference in its entirety herein.

TECHNICAL FIELD

Exemplary embodiments of the present disclosure relate to memories, and more particularly, to a memory controller and a memory system including the same.

DISCUSSION OF THE RELATED ART

A memory device may be implemented using a semiconductor such as silicon (Si), germanium (Ge), gallium arsenide (GaAs), indium phosphide (InP), or the like. Memory devices include volatile memory devices and nonvolatile memory devices.

A volatile memory device refers to a memory device that requires power to maintain stored information. On the other hand, a nonvolatile memory device refers to a memory device that retains stored data even when power to the memory is interrupted. A dynamic random access memory (DRAM) is a type of volatile memory device, which has a high access speed. The DRAM is widely used as a working memory, a buffer memory, or a main memory of a computing system.

A plurality of DRAMs may be provided in a memory module. However, data stored in the DRAMs may include one or more errors. Thus, there is need for a capability of correct errors occurring in the memory module efficiently.

SUMMARY

At least one exemplary embodiment of the inventive concept provides a memory controller capable of correcting errors occurring in a memory module, efficiently.

At least one exemplary embodiment of the inventive concept provides a memory system that includes a memory controller capable of correcting errors occurring in a memory module, efficiently.

According to an exemplary embodiment of the inventive concept, a memory controller controls a memory module including a plurality of data chips, a first parity chip and a second parity chip. The memory controller includes an error correction code (ECC) engine and a central processing unit (CPU) to control the ECC engine. The ECC engine includes an ECC decoder and a memory to store a parity check matrix. The ECC decoder receives error information signals from the plurality of data chips, the error information signals associated with the plurality of data chips, performs an ECC decoding on a read codeword set from the memory module using the parity check matrix to generate a first syndrome and a second syndrome, and corrects a plurality of bit errors in a user data set of the read codeword set based on the error information signals and the second syndrome. The plurality of bit errors are generated by a row fault and uncorrectable based on the first syndrome and the second syndrome. Each of the error information signals includes row fault information indicating whether the row fault occurs in at least one of a plurality of memory cell rows in corresponding one of the data chips.

According to an exemplary embodiment of the inventive concept, a memory system includes a memory module and a memory controller to control the memory module. The memory module includes a plurality of data chips, a first parity chip and a second parity chip. The memory controller includes an error correction code (ECC) engine and a central processing unit (CPU) to control the ECC engine. The ECC engine includes an ECC decoder and a memory to store a parity check matrix. The ECC decoder receives error information signals from the plurality of data chips, the error information signals associated with the plurality of data chips, performs an ECC decoding on a read codeword set from the memory module using the parity check matrix to generate a first syndrome and a second syndrome, and corrects a plurality of bit errors in a user data set of the read codeword set based on the error information signals and the second syndrome. The plurality of bit errors are generated by a row fault and uncorrectable based on the first syndrome and the second syndrome. Each of the error information signals includes row fault information indicating whether the row fault occurs in at least one of a plurality of memory cell rows in corresponding one of the data chips.

According to an exemplary embodiment of the inventive concept, a memory system includes a memory module and a memory controller to control the memory module. The memory module includes a plurality of data chips, a first parity chip and a second parity chip. The memory controller includes an error correction code (ECC) engine and a central processing unit (CPU) to control the ECC engine. The ECC engine includes an ECC decoder and a memory to store a parity check matrix. The ECC decoder receives error information signals from the plurality of data chips, the error information signals associated with the plurality of data chips, performs an ECC decoding on a read codeword set from the memory module using the parity check matrix to generate a first syndrome and a second syndrome, and corrects a plurality of bit errors in a user data set of the read codeword set based on the error information signals and the second syndrome. The plurality of bit errors are generated by a row fault and uncorrectable based on the first syndrome and the second syndrome. Each of the error information signals includes row fault information indicating whether the row fault occurs in at least one of a plurality of memory cell rows in corresponding one of the data chips. The ECC decoder determines that the row fault occurs in at least one of the data chips in response to the first syndrome having a zero value and the second syndrome having a non-zero value.

According to at least one exemplary embodiment of the inventive concept, the ECC engine of the memory controller receives an error information signal from each of data chips in the memory module and may correct a plurality of bit errors generated by a row fault, which are uncorrectable based on syndromes. Therefore, the memory controller may increase efficiency of error correcting.

BRIEF DESCRIPTION OF THE DRAWINGS

The present disclosure will become more apparent by describing in detail exemplary embodiments thereof with reference to the accompanying drawings.

FIG. 8 illustrates an example of a base offset sub matrix which is used for generating offset sub matrixes in a parity sub matrix.

FIG. 9 illustrates an example of a zero sub matrix in the parity generation matrix in FIG. 7.

FIG. 10 illustrates an example of a unit sub matrix in the parity generation matrix in FIG. 7.

DETAILED DESCRIPTION OF THE EXEMPLARY EMBODIMENTS

Figure 1:
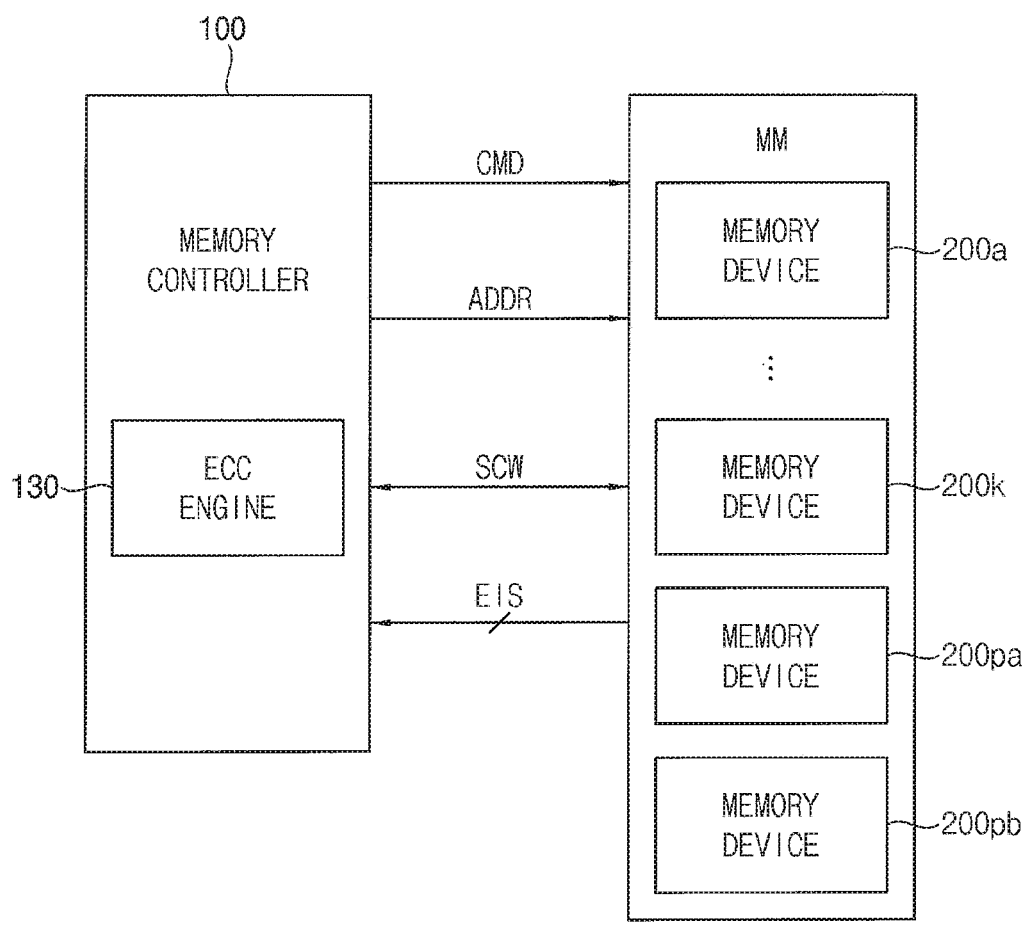
FIG. 1 is a block diagram illustrating a memory system according to an exemplary embodiment of the inventive concept.

Exemplary embodiments of the present disclosure will be described more fully hereinafter with reference to the accompanying drawings. Like reference numerals may refer to like elements throughout the accompanying drawings.

FIG. 1 is a block diagram illustrating a memory system according to an exemplary embodiment of the inventive concept.

Referring to FIG. 1, a memory system 20 includes a memory controller 100 and a memory module MM. The memory module MM includes a plurality of memory chips 200a~200k, 200pa and 200pb. The plurality of memory chips 200a~200k, 200pa and 200pb includes a plurality of data chips 200a~200k, a first parity chip 200pa and a second parity chip 200pb. Each of the memory chips 200a~200k, 200pa and 200pb may be referred to as a semiconductor memory device.

The memory controller 100 may control an overall operation of the memory system 20. The memory controller 100 may control an overall data exchange between a host (e.g., a host device) and the plurality of memory chips 200a~200k, 200pa and 200pb. For example, the memory controller 100 may write data in the plurality of memory chips 200a~200k, 200pa and 200pb or read data from the plurality of memory chips 200a~200k, 200pa and 200pb in response to a request from the host. In addition, the memory controller 100 may issue operation commands to the plurality of memory chips 200a~200k, 200pa and 200pb for controlling the plurality of memory chips 200a~200k, 200pa and 200pb.

In an exemplary embodiment, each of the plurality of memory chips 200a~200k, 200pa and 200pb includes volatile memory cells such as a dynamic random access memory (DRAM).

In an exemplary embodiment of the inventive concept, a number of the data chips 200a~200k is 16. However, the number of the data chips 200a~200k is not limited thereto. In at least one exemplary embodiment, each of the data chips 200a~200k is referred to as a data memory, and each of the parity chips 200pa and 200pb is referred to as an error correction code (ECC) memory, or a redundant memory.

The memory controller 100 transmits an address ADDR and a command CMD to the memory module MM and may exchange a codeword set SCW from the memory module MM. For example, the memory controller 100 can transmit a read command and an address ADDR to the memory module MM, and the memory module MM can output one or more codewords to the memory controller 100 in response to the read command and the address ADDR.

The memory controller 100 includes an error correction code (ECC) engine 130 and the ECC engine 130 may perform an ECC encoding on a user data set and meta data to generate a parity data set and may provide the memory module MM with a codeword including the user data set, the meta data and the parity data set in a write operation of the memory system 20. The user data set may be stored in the data chips 200a~200k, the meta data and a first portion of the parity data set may be stored in the first parity chip 200pa and a second portion of the parity data set may be stored in the second parity chip 200pb.

In addition, the ECC engine 130 may receive error information signals EIS associated with the data chips 200a~200k from the data chips, may perform an ECC decoding on the codeword CW read from the memory module MM using a parity check matrix to generate a first syndrome and a second syndrome, and may correct a plurality of bit errors in a user data set of the codeword set SCW based on the error information signals EIS and the second syndrome. The plurality of bit errors may be generated due to a row fault and may be uncorrectable based on the first syndrome and the second syndrome.

Each of the error information signals EIS may include row fault information indicating whether a row fault occurs in at least one of a plurality of memory cell rows in corresponding one of the data chips 200a~200k.

In addition, each of the error information signals EIS may include address information designates a memory cell row in which the row fault occurs which will be described later with reference to FIG. 18. Therefore, the ECC engine 130 may correct a plurality of bit errors generated due to the row fault based on the error information signal provided from the data chip in which the row fault occurs and the second syndrome.

Figure 2:
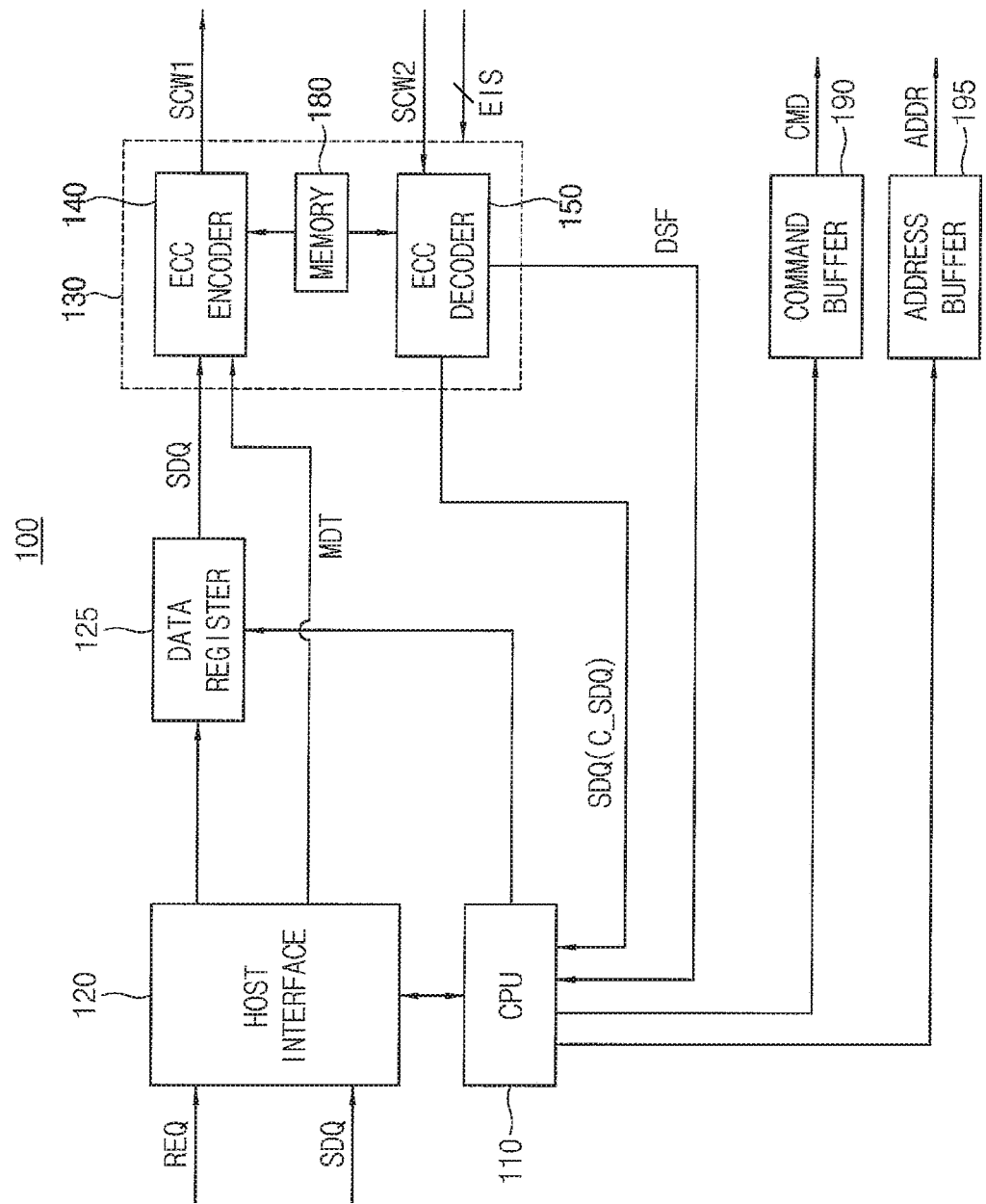
FIG. 2 is block diagram illustrating a memory controller in the memory system of FIG. 1 according to an exemplary embodiment of the inventive concept.

FIG. 2 is block diagram illustrating the memory controller in the memory system of FIG. 1 according to an exemplary embodiment of the inventive concept.

Referring to FIG. 2, the memory controller 100 includes a central processing unit (CPU) 110, a host interface 120 (e.g., an interface circuit), a data register 125, the ECC engine 130, a command buffer 190 and an address buffer 195. The ECC engine 130 includes an ECC encoder 140, an ECC decoder 150 and a memory 180.

The host interface 120 receives a request REQ and a user data set SDQ from the host, generates meta data MDT associated with the user data set SDQ, provides the user data set SDQ to the data register 125 and provides the meta data MDT to the ECC encoder 140. The data register 125 may continuously (or sequentially) output the user data set SDQ to the ECC engine 130. For example, the data register 125 could output part of the user data set SDQ periodically until all of the user data set SDQ has been output to the ECC engine 130.

In an exemplary embodiment, the ECC encoder 140 performs an ECC encoding on the user data set SDQ and the meta data MDT using a parity generation matrix to generate a first codeword set SCW1. The ECC decoder 150 may output a decoding status flag DSF to the CPU 110 using a parity check matrix and provide the CPU 110 with one of the user data set SDQ and a corrected user data set C_SDQ using the parity check matrix. The memory 180 may store the parity generation matrix and the parity check matrix.

The CPU 110 receives the user data set SDQ or the corrected user data set C_SDQ and controls the ECC engine 130, the command buffer 190 and the address buffer 195. The command buffer 190 stores the command CMD corresponding to the request REQ and transmits the command CMD to the memory module MM under control of the CPU 110. The address buffer 195 stores the address ADDR and transmits the address ADDR to the memory module MM under control of the CPU 110. The ECC engine 130 may include a register that stores the error information signals EIS.

In an exemplary embodiment, the ECC decoder 150 performs an ECC decoding on a second codeword set SCW2 (a read codeword set) from the memory module MM using the parity check matrix to generate a first syndrome and a second syndrome and corrects a plurality of bit errors in a user data set of the second codeword set SCW2 based on the error information signals EIS and the second syndrome. The plurality of bit errors may be uncorrectable using the first syndrome and the second syndrome, and each of the error information signals EIS may include row fault information indicating whether a row fault occurs in at least one of a plurality of memory cell rows in corresponding one of the data chips 200a~200k.

Figure 3:
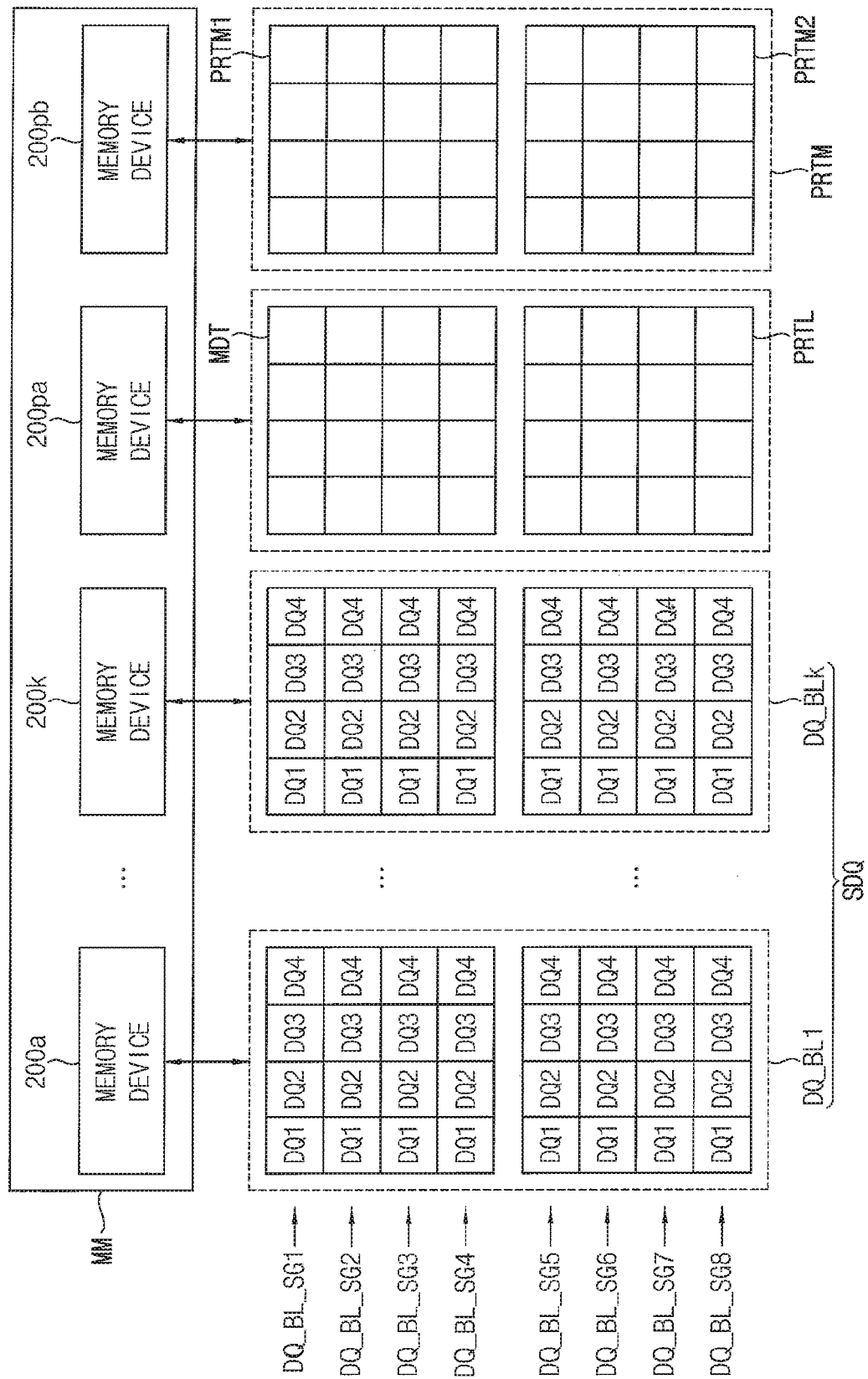
FIG. 3 illustrates data sets corresponding to a plurality of burst lengths in the memory system of FIG. 1, according to exemplary embodiments of the inventive concept.

FIG. 3 illustrates data sets corresponding to a plurality of burst lengths in the memory system of FIG. 1, according to an exemplary embodiment of the inventive concept.

Referring to FIG. 3, each of the data chips 200a~200k and the parity chips 200pa and 200pb may perform a burst operation. Herein, the burst operation refers to an operation of writing or reading a large amount of data by sequentially increasing or decreasing an initial address provided from the memory controller 100. A basic unit of the burst operation may be referred to as a burst length BL.

Referring to FIG. 3, each of the data sets DQ_BL1~DQ_BLk corresponding to the plurality of burst lengths are input to/output from each of the data chips 200a~200k.

Each of the data sets DQ_BL1~DQ_BLk may include data segments DQ_BL_SG1~DQ_BL_SG18 corresponding to each burst length of the plurality of burst lengths. The data sets DQ_BL1~DQ_BLk may correspond to the user data set SDQ. The burst length is assumed to be 8 in FIG. 3 While the burst operation is performed in each of the data chips 200a~200k, the meta data MDT and first parity data PRTL corresponding to the plurality of burst lengths are input to/output from the first parity chip 200pa and a first sub parity data PRTM1 and a second sub parity data PRTM2 corresponding to the plurality of burst lengths are input to/output from the second parity chip 200pb. A second parity data PRTM includes the first sub parity data PRTM1 and the second sub parity data PRTM2.

The first parity data PRTL may be referred to as an error locator parity data and may be associated with locations of bit errors in the user data set SDQ and the second parity data PRTM may be referred to as an error magnitude parity data and may be associated with a magnitude (a quantity or number) of the bit errors in the user data set SDQ.

Figure 4:
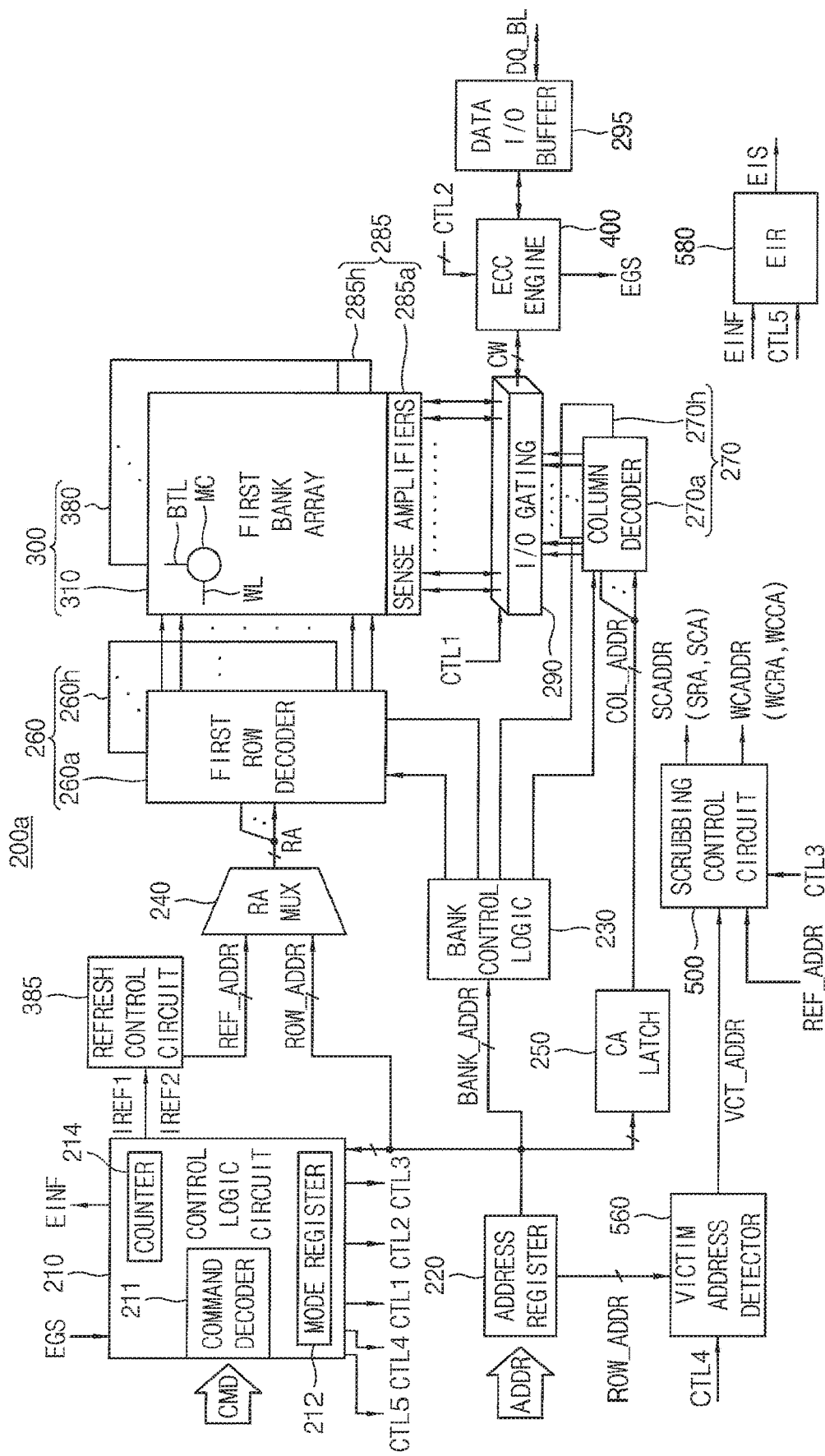
FIG. 4 is a block diagram illustrating a data chip in the memory module of FIG. 1 according to an exemplary embodiment of the inventive concept.

FIG. 4 is a block diagram illustrating one of the data chips in the memory module of FIG. 1 according to an exemplary embodiment of the inventive concept.

Referring to FIG. 4, the data chip 200a includes the control logic circuit 210, an address register 220, a bank control logic 230, a refresh control circuit 385, a row address multiplexer 240, a column address latch 250, a row decoder 260, a column decoder 270, the memory cell array 300, a sense amplifier unit 285, an I/O gating circuit 290, the ECC engine 400, the scrubbing control circuit 500, a victim address detector 560, an error information register 580 and a data I/O buffer 295.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310-380, and the sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and the first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL. The memory cells MC may be volatile memory cells.

Although the data chip 200a is illustrated in FIG. 4 as including eight banks, the data chip 200a may include any number of banks.

The address register 220 receives the address ADDR including a bank address BANK_ADDR, a row address ROW_ADDR, and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 receives the row address ROW_ADDR from the address register 220, and receives a refresh row address REF_ADDR from the refresh control circuit 385. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The refresh control circuit 385 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may apply the first refresh control signal IREF1 to the refresh control circuit 385 whenever the control logic circuit 210 receives the auto refresh command.

When the command CMD from the memory controller 100 corresponds to a self-refresh entry command, the control logic circuit 210 may apply the second refresh control signal IREF2 to the refresh control circuit 385. In an exemplary embodiment, the second refresh control signal IREF2 is activated from a time point when the control logic circuit 210 receives the self-refresh entry command to a time point when control logic circuit 210 receives a self-refresh exit command. The refresh control circuit 385 may sequentially increase or decrease the refresh row address REF_ADDR in response to receiving the first refresh control signal IREF1 or during a period when the second refresh control signal IREF2 is activated.

The activated one of the first through eighth bank row decoders 260a~260h may decode the row address RA that is output from the row address multiplexer 240, and may activate a word-line WL corresponding to the row address RA. For example, the activated bank row decoder may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In an exemplary embodiment of the inventive concept, in a burst mode, the column address latch 250 generates column addresses that increment from the received column address COL_ADDR. The column address latch 250 may apply the temporarily stored or generated column address COL_ADDR to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310~380, and write control devices for writing data to the first through eighth bank arrays 310~380.

A codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The user data DQ_BL to be written in one bank array of the first through eighth bank arrays 310-380 may be provided to the data I/O buffer 295 from the memory controller 100 and may be provided to the ECC engine 400 from the data I/O buffer 295. The ECC engine 400 may perform an ECC encoding on the user data DQ_BL to generate parity data (a third parity data), the ECC engine 400 may provide a codeword CW including the user data DQ_BL and the parity data to the I/O gating circuit 290 and the I/O gating circuit 290 may write the codeword CW in a sub-page of a target page in one bank array through the write drivers.

The data I/O buffer 295 may provide the user data DQ_BL from the memory controller 100 to the ECC engine 400 in a write operation of the data chip 200a and may provide the user data DQ_BL from the ECC engine 400 to the memory controller 100 in a read operation of the data chip 200a.

In an exemplary embodiment, the ECC engine 400 sequentially performs an ECC decoding (error detection operation) on M codewords read from a sub-page of the target page (a first memory cell row) and provides an error generation signal EGS to the control logic circuit 210 when at least one bit error is detected in at least one of the M (M being an integer greater than three) codewords in a scrubbing operation during a refresh operation of the data chip 200a. The control logic circuit 210 may record a row address and a column address of the codeword including the at least one bit error, in the error information register 580 as an error information EINF.

The control logic circuit 210 may determine that a row fault occurs in the first memory cell row in response to the bit error being detected in K (K being an integer greater than two) or more codewords from M codewords of the first memory cell row based on the error information EINF and may transmit the error information signal EIS including the row fault information to the memory controller 100.

The control logic circuit 210 may control the ECC engine 400 based on the error information EINF such that the ECC engine 400 writes back correctable codewords in corresponding memory locations, respectively, in response to a number of the correctable codewords of the M codewords being smaller than K, and each of the correctable codewords includes an bit error to be corrected by the ECC engine 400.

The ECC engine 400 may perform an ECC decoding on the codeword read from the target page, may correct a bit error in the codeword and may provide a corrected user data DQ_BL to the data I/O buffer 295 in a normal read operation of the data chip 200a.

The scrubbing control circuit 500 may count the refresh row address REF_ADDR which sequentially changes and may output (e.g., generate) a normal scrubbing address SCADDR whenever (e.g., in response to) the scrubbing control circuit 500 counts N refresh row addresses. Here, N is a natural number greater than three. The normal scrubbing address SCADDR may include a scrubbing row address SRA and a scrubbing column address SCA. The scrubbing control circuit 500 may provide the scrubbing row address SRA and the scrubbing column address SCA to the row decoder 260 and the column decoder 270, respectively in a first scrubbing mode.

The victim address detector 560 may count a number (e.g., quantity) of accesses to a first memory region in the memory cell array 300 to generate at least one victim address VCT_ADDR designating at least one adjacent memory region adjacent to the first memory region when (e.g., in response to a determination that) the number of the counted accesses reaches a threshold value (e.g., the reference number (e.g., quantity) of times during a reference interval). The at least one victim address VCT_ADDR may be stored in an address storing table of the scrubbing control circuit 500.

The scrubbing control circuit 500, in a second scrubbing mode, may output an address of codeword associated with the at least one victim address VCT_ADDR stored in the address storing table as at least one weak codeword address WCADDR. The weak codeword address WCADDR may include a weak codeword row address WCRA and a weak codeword column address WCCA. The scrubbing control circuit 500 may provide the weak codeword row address WCRA and the weak codeword column address WCCA to the row decoder 260 and the column decoder 270, respectively in the second scrubbing mode.

Accordingly, it will be understood that the victim address detector 560 may provide at least one victim address VCT_ADDR to the scrubbing control circuit 500, and the scrubbing control circuit 500 may store the at least one victim address VCT_ADDR in an address storing table therein as at least one weak codeword address WCADDR.

The control logic circuit 210 may control operations of the data chip 200a. For example, the control logic circuit 210 may generate control signals for the data chip 200a in order to perform a write operation or a read operation. The control logic circuit 210 includes a command decoder 211 that decodes the command CMD received from the memory controller 100 and a mode register 212 that sets an operation mode of the data chip 200a. The control logic circuit 210 may additionally include a counter 214 that counts a number of error occurrences of one codeword or one memory cell row based on the error generation signal EGS.

For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290, a second control signal CTL2 to control the ECC engine 400 (e.g., to cause the ECC engine to generate an error generation signal EGS), a third control signal CTL3 to control the scrubbing control circuit 500, a fourth control signal CTL4 to control the victim address detector 560 and a fifth control signal CTL5 to control the error information register 580.

In an exemplary embodiment, the victim address detector 560 is not included in the data chip 200a. In this case, the at least one victim address VCT_ADDR is not provided to the scrubbing control circuit 500 and the scrubbing control circuit 500 does not output the weak codeword address WCADDR.

The error information register 580 may provide (transmit) row fault information associated with at least one memory cell row in which the row fault occurs among the plurality of memory cell rows to the memory controller 100 based on the error information EINF as the error information signal EIS. The error information register 580 may transmit the error information signal EIS to the memory controller 100 via one of a data mask pin or an alert pin of the data chip 200a in response to the fifth control signal CTL5.

Since the scrubbing operation is performed during the refresh operation of the data chip 200a, the control logic circuit 210 records the error information EINF in the error information register 580 and determines whether the row fault occurs in at least some of the memory cell rows in a background operation. The background operation may be hidden from the memory controller 100. For example, the data chip 200a may perform the scrubbing operation independently of the memory controller 100.

Each of the parity chips 200pa and 200pb may have substantially the same configuration as the data chip 200a. Each of the parity chips 200pa and 200pb may input/output a corresponding parity data.

Figure 5:
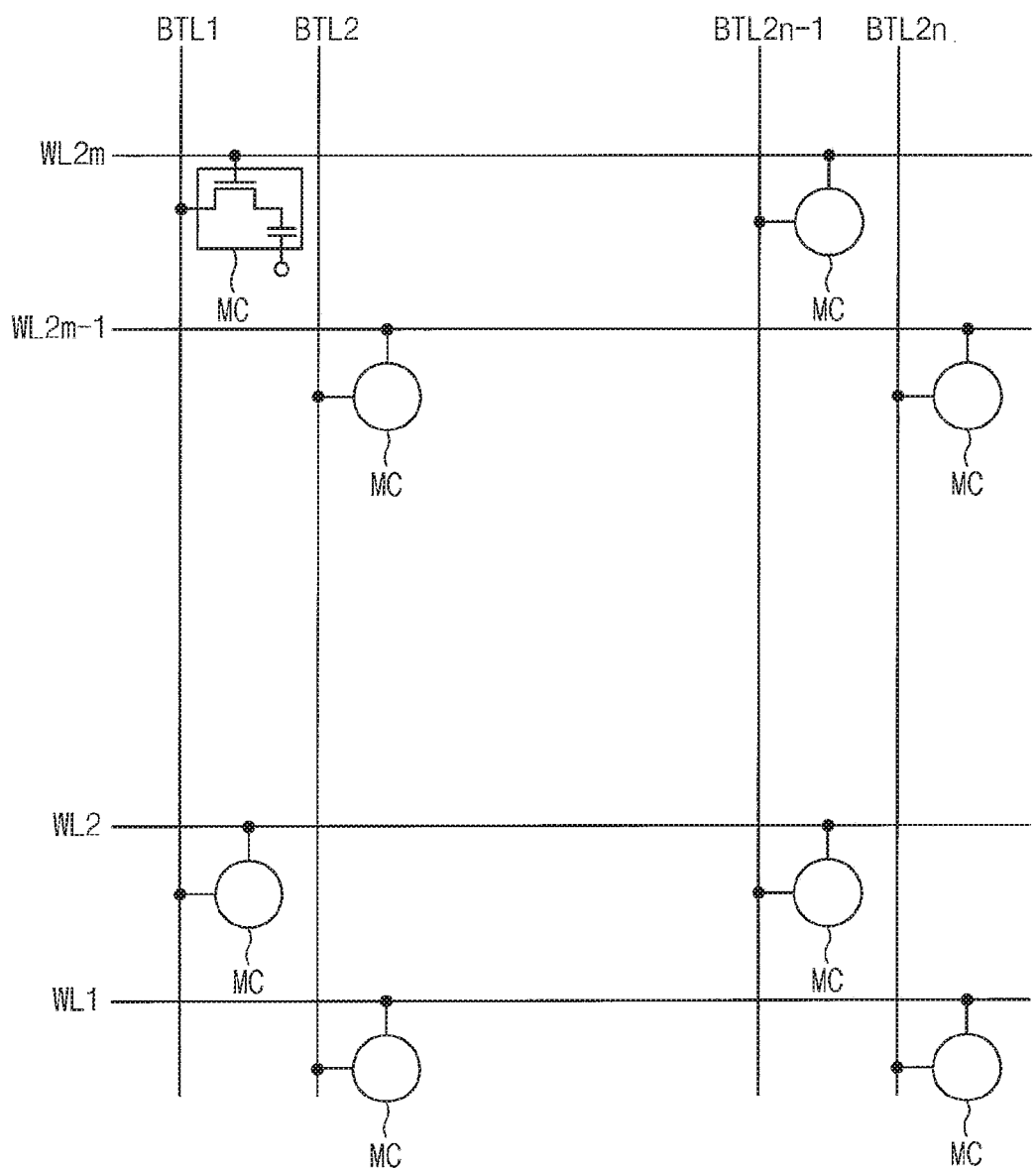
FIG. 5 illustrates a first bank array of the data chip of FIG. 4 according to an exemplary embodiment of the inventive concept.

FIG. 5 illustrates a first bank array of the data chip of FIG. 4 according to an exemplary embodiment of the inventive concept.

Referring to FIG. 5, the first bank array 310 includes a plurality of word-lines WL1~WL2m (where m is a natural number greater than two), a plurality of bit-lines BTL1~BTL2n (where n is a natural number greater than two), and a plurality of memory cells MCs disposed near intersections between the word-lines WL1~WL2m and the bit-lines BTL1~BTL2n. In an exemplary embodiment of the inventive concept, each of the plurality of memory cells MCs includes a DRAM cell structure. The plurality of word-lines WL1~WL2m to which the plurality of memory cells MCs are connected may be referred to as rows of the first bank array 310 and the plurality of bit-lines BL1~BL2n to which the plurality of memory cells MCs are connected may be referred to as columns of the first bank array 310.

Figure 6:
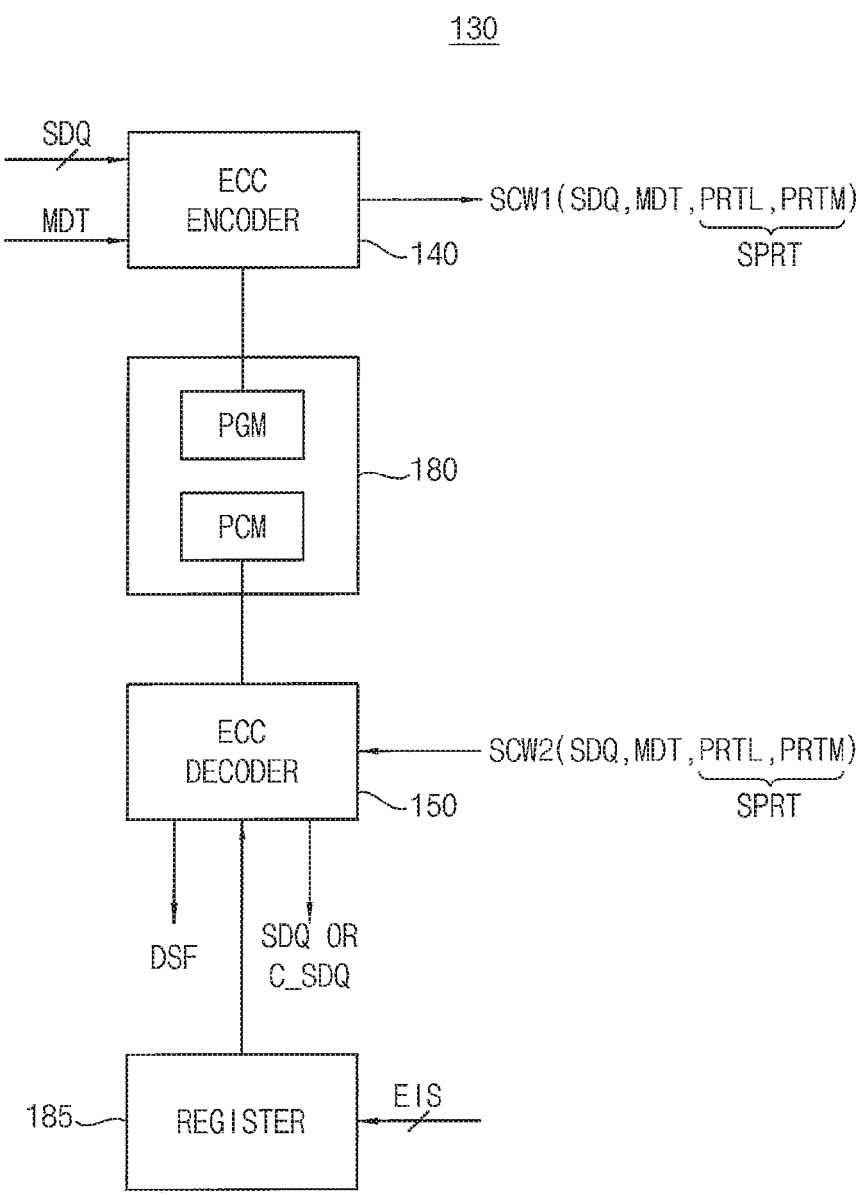
FIG. 6 is a block diagram illustrating an example of an ECC engine in FIG. 2 according to an exemplary embodiment of the inventive concept.

FIG. 6 is a block diagram illustrating the ECC engine in FIG. 2 according to an exemplary embodiment of the inventive concept.

Referring to FIG. 6, the ECC engine 130 includes an ECC encoder 140, an ECC decoder 150 and a memory 180. The memory 180 may be referred to as an ECC memory.

The memory 180 is connected to the ECC encoder 140 and the ECC decoder 150 and may store a parity generation matrix PGM and a parity check matrix PCM.

In an exemplary embodiment, the ECC encoder 140 performs an ECC encoding on the user data set SDQ and the meta data MDT by using the parity generation matrix PCM to generate a parity data set SPRT including a first parity data PRTL and a second parity data PRTM and outputs a first codeword set SCW1 including the user data set SDQ, the meta data MDT and the parity data set SPRT.

The ECC decoder 150 receives a second codeword set SCW2 including the user data set SDQ, the meta data MDT and the parity data set SPRT from the memory module MM. The ECC decoder 150 is connected to the register 185 and receives the error information signals EIS. In an exemplary embodiment of the inventive concept, the ECC decoder 150 performs an ECC decoding on the second codeword set SCW2 using the parity check matrix PCM to generate a first syndrome and a second syndrome, may correct bit errors in the user data set SDQ using the first syndrome and the second syndrome to generate corrected user data C_SDQ and may generate a decoding status flag DSF indicating that bit errors in the user data set SDQ have been corrected while outputting the corrected user data set C_SDQ.

The ECC decoder 150 may perform the ECC decoding to generate the first syndrome and the second syndrome, may correct multiple bit errors in the user data set SDQ, which are uncorrectable based on the first syndrome and the second syndrome, by using the error information signals EIS and the second syndrome and may output the corrected user data set C_SDQ.

Figure 7:
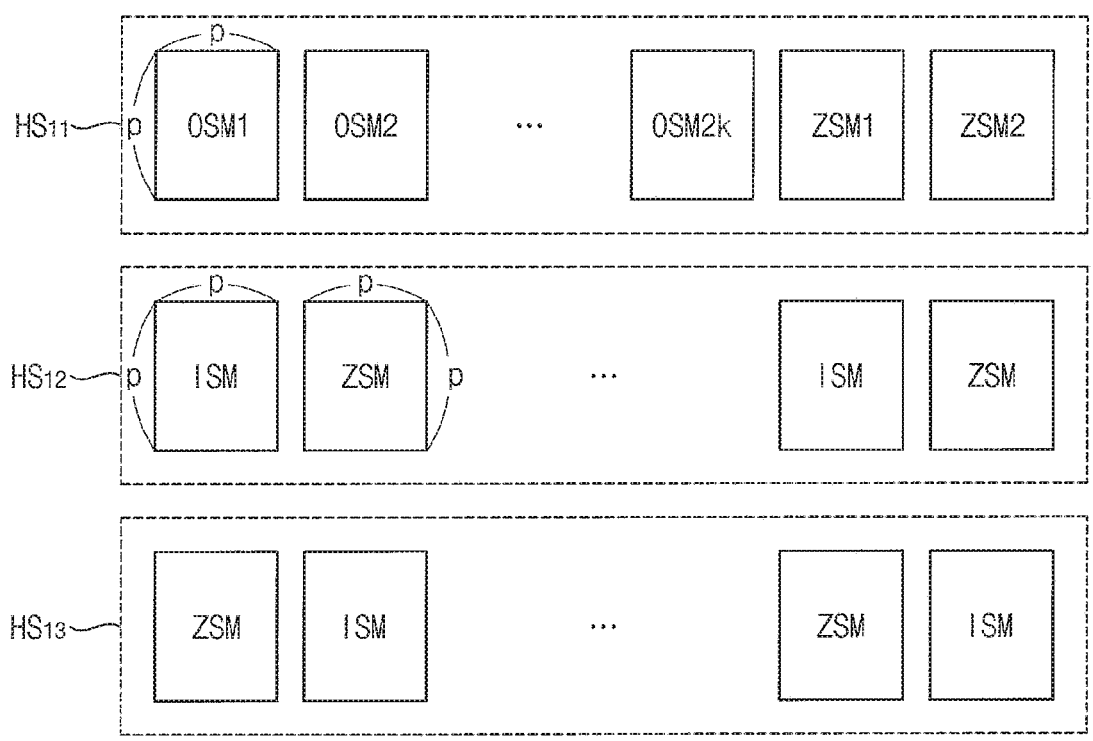
FIG. 7 illustrates an example of a parity generation matrix stored in the memory in the ECC engine of FIG. 6.

FIG. 7 illustrates an example of a parity generation matrix stored in a memory of the ECC engine of FIG. 6.

Referring to FIG. 7, the parity generation matrix PGM includes a first parity sub matrix $HS_{11}$, a second parity sub matrix $HS_{12}$ and a third parity sub matrix $HS_{13}$.

The first parity sub matrix $HS_{11}$ includes a plurality of offset sub matrixes OSM1~OSM2$k$ corresponding to the data chips 200$a$~200$k$ and two zero sub matrixes ZSM1 and ZSM2 corresponding to the parity chips 200$pa$ and 200$pb$. Each of the offset sub matrixes OSM1~OSM2$k$ and the zero sub matrixes ZSM1 and ZSM2 includes p×p elements (p is a natural number greater than one).

The second parity sub matrix $HS_{12}$ includes a plurality of (k+1) unit sub matrixes ISMs and a plurality of (k+1) zero sub matrixes ZSMs. Each of the (k+1) unit sub matrixes ISMs and the (k+1) zero sub matrixes ZSMs includes p×p elements. In addition, the (k+1) unit sub matrixes ISMs and the (k+1) zero sub matrixes ZSMs are alternatingly arranged.

The third parity sub matrix $HS_{13}$ includes a plurality of (k+1) zero sub matrixes ZSMs and a plurality of (k+1) unit sub matrixes ISMs. Each of the (k+1) zero sub matrixes ZSMs and the (k+1) unit sub matrixes ISMs includes p×p elements. In addition, the (k+1) zero sub matrixes ZSMs and the (k+1) unit sub matrixes ISMs are alternatingly arranged.

Figures 8, 9:
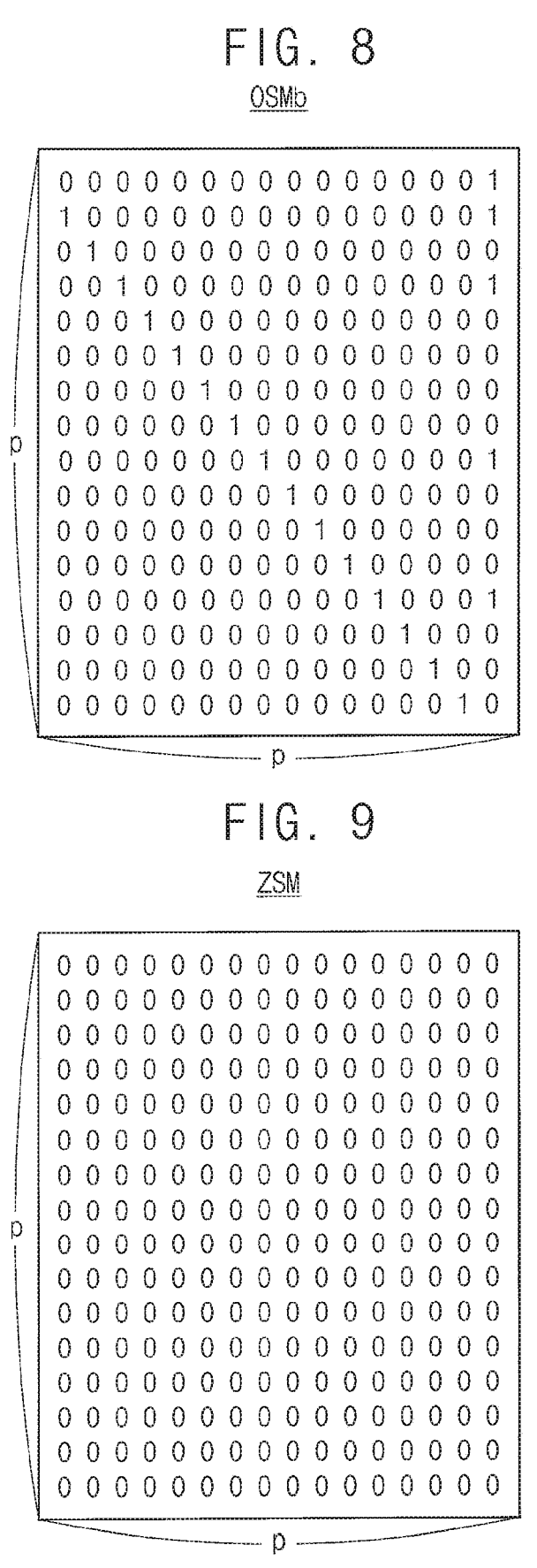

FIG. 8 illustrates an example of a base offset sub matrix, which may be used for generating the offset sub matrixes in the first parity sub matrix.

Referring to FIG. 8, a base offset sub matrix OSMb may include (p+3) high level elements. The base offset sub matrix OSMb may be obtained based on a primitive polynomial such as $x^{16}+x^{12}+x^3+x+1$. If a p-th order primitive polynomial is varied, elements of each of the offset sub matrixes OSM1~OSM2$k$ may be varied.

The offset sub matrix OSM1 of the offset sub matrixes OSM1~OSM2$k$ may be obtained by powers of the base offset sub matrix OSMb. The offset sub matrix OSM2 of the offset sub matrixes OSM1~OSM2$k$ may be obtained by multiplying the offset sub matrix OSM1 and a sub matrix obtained by powers of the base offset sub matrix OSMb by an offset.

In addition, a gap between two offset sub matrixes OSM(2$i$-1) and OSM(2$i$) associated with one (memory) chip of the offset sub matrixes OSM1~OSM2$k$ is regular. Here, i is one of one through eight. That is, the offset sub matrix OSM4 may be obtained by multiplying the offset sub matrix OSM3 and a sub matrix obtained by powers of the base offset sub matrix OSMb by an offset.

FIG. 9 illustrates an example of a zero sub matrix in the parity generation matrix in FIG. 7.

Referring to FIG. 9, in a zero sub matrix ZSM corresponding to each of the zero sub matrixes ZSMs, each of its elements is set to zero.

FIG. 10 illustrates an example of a unit sub matrix in the parity generation matrix in FIG. 7.

Referring to FIG. 10, a unit sub matrix ISM corresponding to each of the unit sub matrixes ISMs includes p high level elements disposed in a diagonal direction. Each of other elements except the high level elements is set to zero.

In FIGS. 7 through 10, p may correspond to 16 and may correspond to a number of bits of the data set DQ_BL which are input to/output from each of the data chips 200$a$~200$k$ during one burst operation. In addition, a number of non-zero elements in the first parity sub matrix $HS_{11}$ may be greater than a number of non-zero elements in the second parity sub matrix $HS_{12}$ or a number of non-zero elements in the third parity sub matrix $HS_{13}$.

Figure 11:
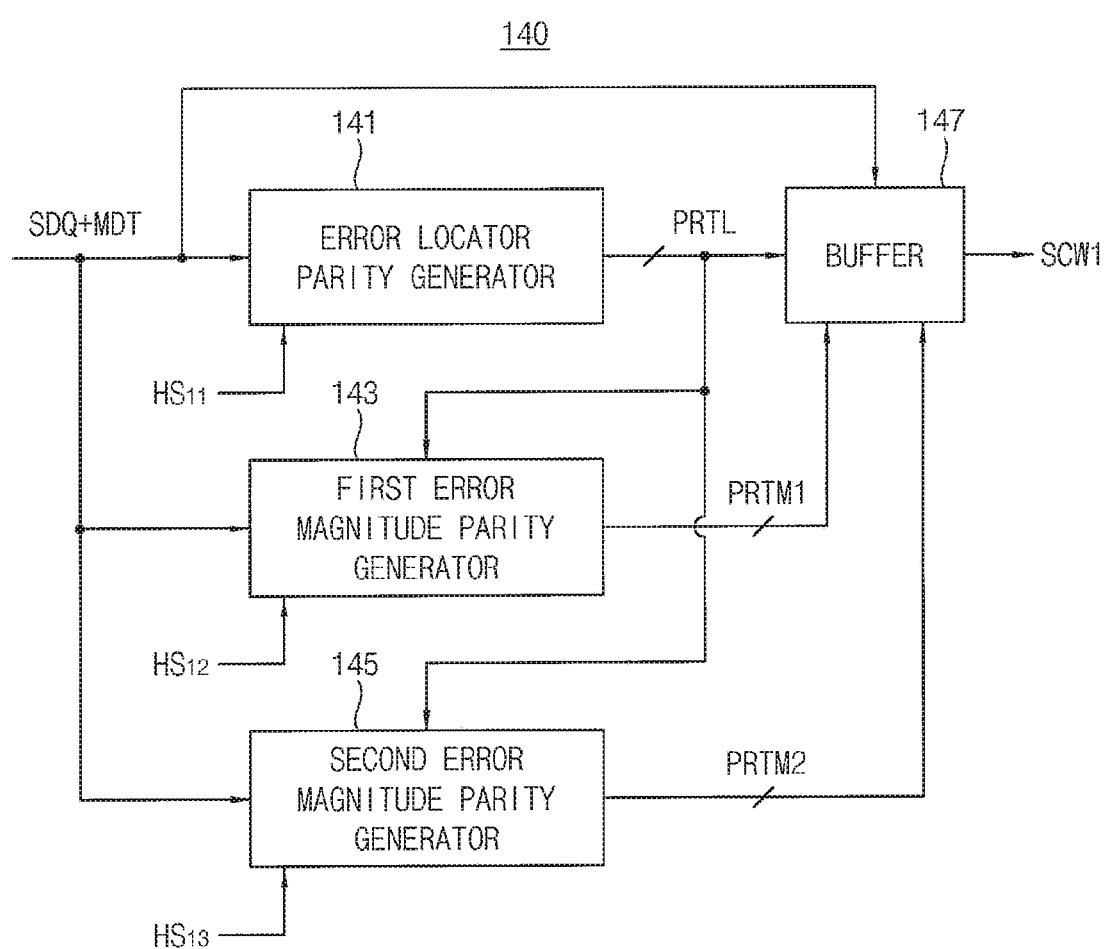
FIG. 11 illustrates an ECC encoder in the ECC engine of FIG. 6 according to an exemplary embodiment of the inventive concept.

FIG. 11 illustrates the ECC encoder in the ECC engine of FIG. 6 according to an exemplary embodiment of the inventive concept.

Referring to FIG. 11, the ECC encoder 140 includes an error locator parity generator 141, a first error magnitude parity generator 143, a second error magnitude parity generator 145 and a buffer 147.

The error locator parity generator 141 performs an ECC encoding on the user data set SDQ and the meta data MDT by using the first parity sub matrix $HS_{11}$ to generate the first parity data PRTL which is used for determining locations of errors and provides the first parity data PRTL to the buffer 147. The first parity data PRTL may be referred to as a first parity data.

The error locator parity generator 141 may generate the first parity data PRTL by performing a matrix-multiplication operation on the user data set SDQ and the meta data MDT with the first parity sub matrix $HS_{11}$. If a vector representation of the user data set SDQ and the meta data MDT corresponds to ms and a vector representation of the error locator parity data PRTL corresponds to $p_L$, $p_L = HS_{11}[\text{ms } 0]^T$. Here, T represents a transposed matrix and 0 represents a zero matrix.

The first error magnitude parity generator 143 performs an ECC encoding on the user data set SDQ and the meta data MDT by using the second parity sub matrix $HS_{12}$ to generate the first sub parity data PRTM1 which is used for determining a number of bit errors and provides the first error magnitude parity data PRTM1 to the buffer 147. The first sub parity data PRTM1 may be referred to as a first error magnitude parity data.

The first error magnitude parity generator 143 may generate the first sub parity data PRTM1 by performing a matrix-multiplication operation on the user data set SDQ and the meta data MDT with the second parity sub matrix $HS_{12}$. If a vector representation of the first sub parity data PRTM1 corresponds to $p_{M1}$, $p_{M1} = HS_{12}[\text{ms } p_L \ 0]^T$.

The second error magnitude parity generator 145 performs an ECC encoding on the user data set SDQ and the meta data MDT by using the third parity sub matrix $HS_{13}$ to generate the second sub parity data PRTM2 which is used for determining a number of bit errors and provides the second error magnitude parity data PRTM2 to the buffer 147. The second sub parity data PRTM2 may be referred to as a second error magnitude parity data.

The second error magnitude parity generator 145 may generate the second sub parity data PRTM2 by performing a matrix-multiplication operation on the user data set SDQ and the meta data MDT with the third parity sub matrix $HS_{13}$. If a vector representation of the second error magnitude parity data PRTM2 corresponds to $p_{M2}$, $p_{M2}=HS_{13}[ms\ p_L\ 0]^T$. The first sub parity data PRTM1 and the second sub parity data PRTM2 may be included in the second parity data PRTM.

The buffer 147 receives the user data set SDQ, the meta data MDT, the first parity data PRTL, the first sub parity data PRTM1 and the second sub parity data PRTM2 and provides the memory module MM with the codeword set SCW1 including the user data set SDQ, the meta data MDT, the first parity data PRTL, the first sub parity data PRTM1 and the second sub parity data PRTM2.

Figure 12:
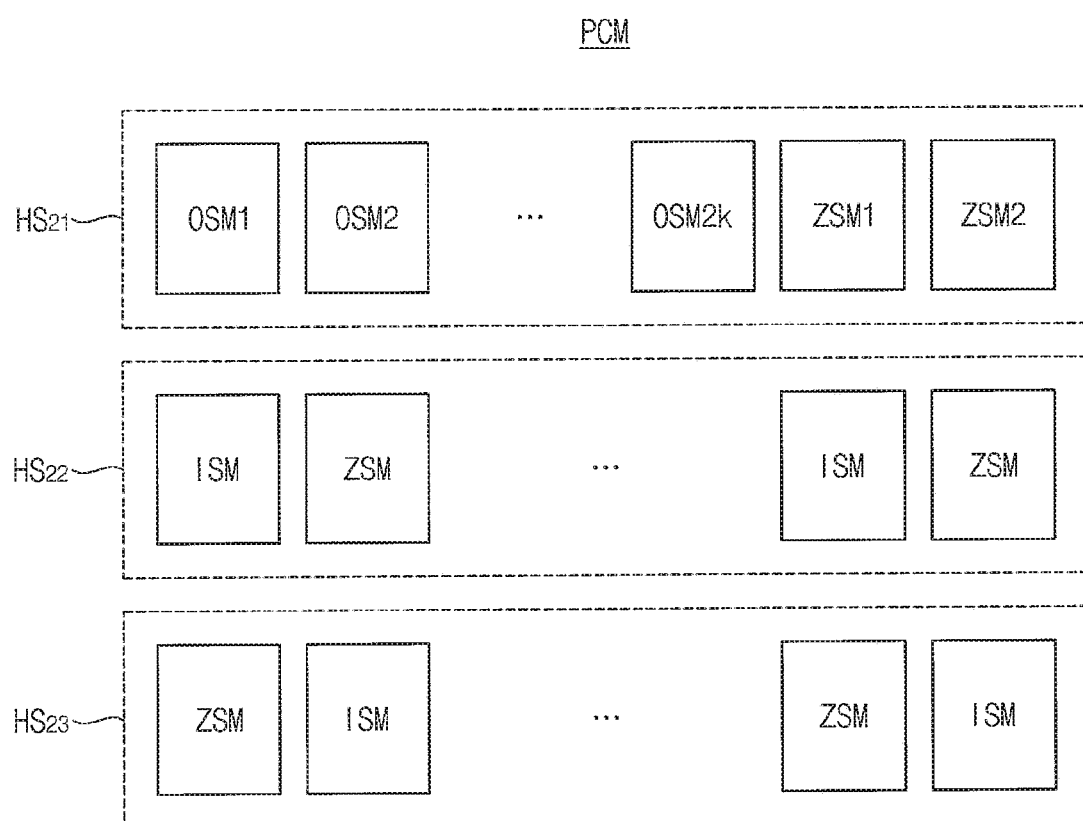
FIG. 12 illustrates an example of a parity check matrix stored in the memory in the ECC engine of FIG. 6.

FIG. 12 illustrates an example of a parity check matrix stored in a memory of the ECC engine of FIG. 6.

Referring to FIG. 12, the parity check matrix PCM includes a first parity sub matrix $HS_{21}$, a second parity sub matrix $HS_{22}$ and a third parity sub matrix $HS_{23}$.

The first parity sub matrix $HS_{21}$ includes a plurality of offset sub matrixes OSM1~OSM2k corresponding to the data chips 200a~200k and two zero sub matrixes ZSM1 and ZSM2 corresponding to the parity chips 200pa and 200pb. Each of the offset sub matrixes OSM1~OSM2k and the zero sub matrixes ZSM1 and ZSM2 includes p×p elements.

The second parity sub matrix $HS_{22}$ includes a plurality of (k+1) unit sub matrixes ISMs and a plurality of (k+1) zero sub matrixes ZSMs. Each of the (k+1) unit sub matrixes ISMs and the (k+1) zero sub matrixes ZSMs includes p×p elements. In addition, the (k+1) unit sub matrixes ISMs and the (k+1) zero sub matrixes ZSMs are alternatingly arranged.

The third parity sub matrix $HS_{23}$ includes a plurality of (k+1) zero sub matrixes ZSMs and a plurality of (k+1) unit sub matrixes ISMs. Each of the (k+1) zero sub matrixes ZSMs and the (k+1) unit sub matrixes ISMs includes p×p elements. In addition, the (k+1) zero sub matrixes ZSMs and the (k+1) unit sub matrixes ISMs are alternatingly arranged.

Referring to FIGS. 7 and 12, the first parity sub matrix $HS_{21}$ is the same as the first parity sub matrix $HS_{11}$ and the second parity sub matrix $HS_{22}$ is the same as the second parity sub matrix $HS_{12}$. The third parity sub matrix $HS_{23}$ is the same as the third sub matrix $HS_{13}$. In addition, the ECC encoder 141 and the ECC decoder 150 in FIG. 6 share the parity generation matrix PGM and perform ECC encoding and ECC decoding, respectively. The parity generation matrix PGM may be equivalent to the parity check matrix PCM in FIG. 6.

Figure 13:
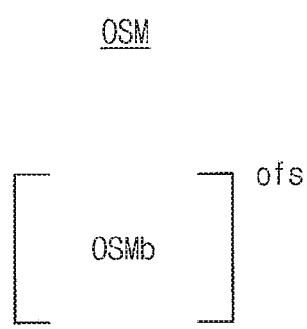
FIG. 13 illustrates an example of an offset sub matrix in FIG. 12.

FIG. 13 illustrates an example of the offset sub matrix in FIG. 12.

Referring to FIG. 13, the offset sub matrix OSM may be obtained by powers of the base offset sub matrix OSMb by an offset ofs.

Referring to FIGS. 12 and 13, a number of non-zero elements in the first parity sub matrix $HS_{21}$ may be greater than a number of non-zero elements in the second parity sub matrix $HS_{22}$ or a number of non-zero elements in the third parity sub matrix $HS_{23}$. Therefore, the ECC decoder 150 in FIG. 6 generates a first syndrome by using the first parity sub matrix $HS_{21}$, generates a second syndrome by using the second parity sub matrix $HS_{22}$ and the third parity sub matrix $HS_{23}$, and determines whether the user data set SDQ includes correctable bit errors based on the first syndrome and the second syndrome. If the user data set SDQ includes uncorrectable bit errors based on the first syndrome and the second syndrome, the ECC decoder 150 may correct the bit errors, which are uncorrectable based on the first syndrome and the second syndrome, by using the error information signals EIS and the second syndrome.

Figure 14:
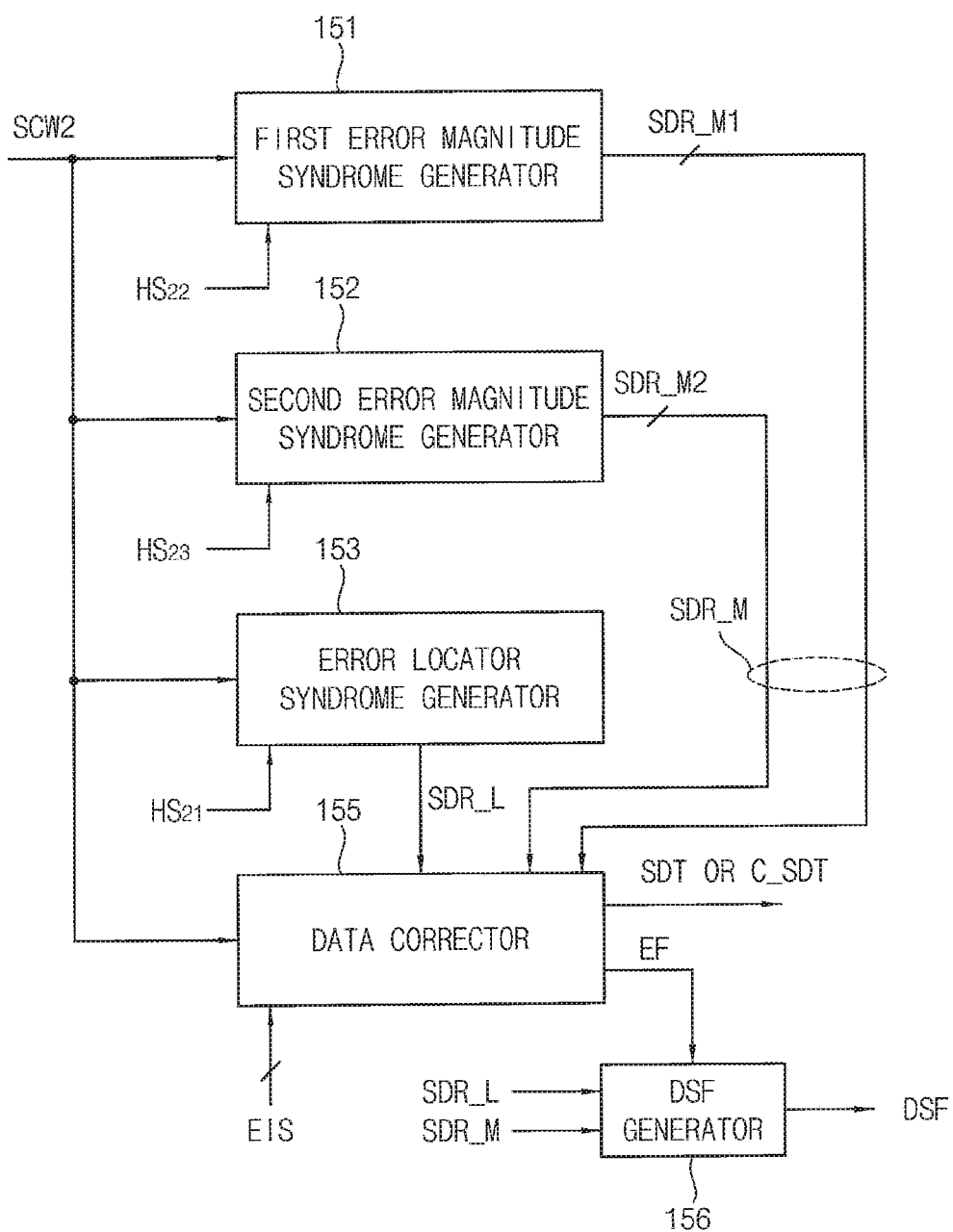
FIG. 14 illustrates an ECC decoder in the ECC engine of FIG. 6 according to an exemplary embodiment of the inventive concept.

FIG. 14 illustrates the ECC decoder in the ECC engine of FIG. 6 according to an exemplary embodiment of the inventive concept.

Referring to FIG. 14, the ECC decoder 150 includes a first error magnitude syndrome generator 151, a second error magnitude syndrome generator 152, an error locator syndrome generator 153, a data corrector 155 and a decoding status flag generator 156.

The first error magnitude syndrome generator 151 generates a first sub syndrome SDR_M1 indicating a number of bit errors by performing a matrix-multiplication operation on the read codeword set SCW2 and the second parity sub matrix $HS_{22}$. If a vector representation of the read codeword set SCW2 corresponds to $r^T$ and a vector representation of the first sub syndrome SDR_M1 corresponds to $S_{M01}$, $S_{M01}=HS_{22}r^T$.

The second error magnitude syndrome generator 152 generates a second sub syndrome SDR_M2 indicating a number of bit errors by performing a matrix-multiplication operation on the read codeword set SCW2 and the third parity sub matrix $HS_{23}$. If a vector representation of the second sub syndrome SDR_M2 corresponds to $S_{M02}$, $S_{M02}=HS_{23}r^T$.

The first sub syndrome SDR_M1 and the second sub syndrome SDR_M2 are included in a second syndrome SDR_M, i.e., an error magnitude syndrome.

The error locator syndrome generator 153 generates a first syndrome SDR_L indicating positions of correctable errors in the read codeword set SCW2 and provides the first syndrome SDR_L to the data corrector 155. If a vector representation of the first syndrome SDR_L corresponds to $S_L$, $S_L=HS_{21}r^T$.

The data corrector 155 may correct correctable bit errors in the user data set SDQ of the read codeword set SCW2 based on the first syndrome SDR_L and the second syndrome SDR_M or correct multiple bit errors in the user data set SDQ, which could not be corrected based on the first syndrome SDR_L and the second syndrome SDR_M, by using the second syndrome SDR_M and the error information signal EIS to output the corrected user data set C_SDQ or the user data set SDQ. In addition, the data corrector 155 may output an error flag EF indicating whether the bit errors are corrected to the decoding status flag generator 156.

The decoding status flag generator 156 may generate the decoding status flag DSF indicating whether the user data set SDQ in the codeword CW2 includes correctable bit errors bits or uncorrectable bit errors based on values of the first second syndrome SDR_L and the second syndrome SDR_M.

The decoding status flag generator 156 may generate the decoding status flag DSF indicating that user data set SDQ includes correctable bit errors based on the first syndrome SDR_L and the second syndrome SDR_M, in response to the first syndrome SDR_L having a non-zero value and the second syndrome SDR_M having a non-zero value.

The decoding status flag generator 156 may generate the decoding status flag DSF indicating that user data set SDQ includes multiple bit errors, which could not be corrected based on the first syndrome SDR_L and the second syndrome SDR_M, in response to the first syndrome SDR_L having a zero value and the second syndrome SDR_M having a non-zero value. In this case, the ECC decoder 150 may correct the multiple bit errors based on the first syndrome SDR_L and the second syndrome SDR_M by using the error information signals EIS and the second syndrome SDR_M.

Figure 15:
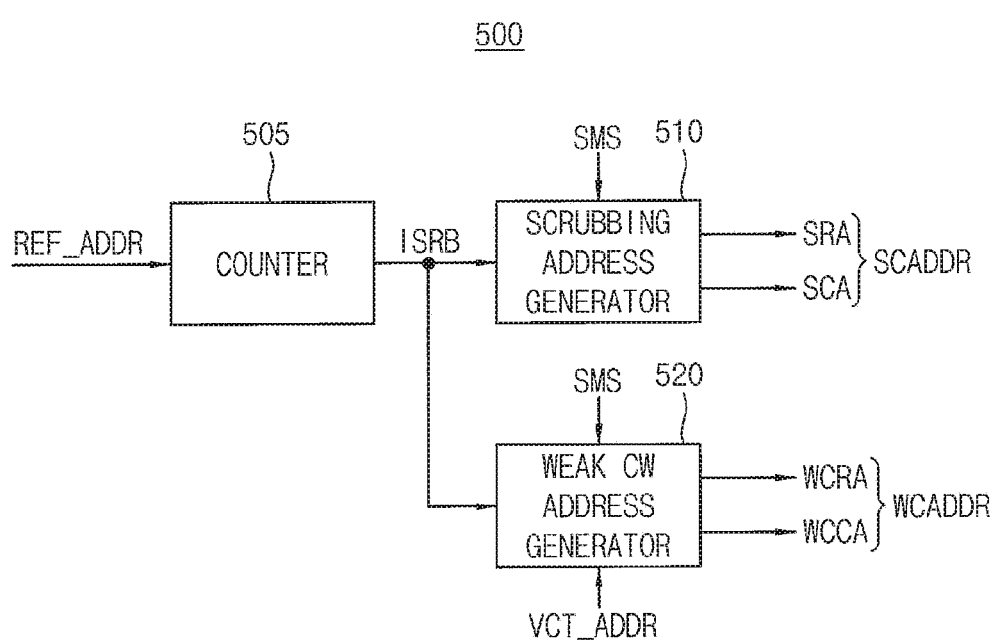
FIG. 15 is a block diagram illustrating an example of a scrubbing control circuit in the data chip of FIG. 4 according to an exemplary embodiment of the inventive concept.

FIG. 15 is a block diagram illustrating the scrubbing control circuit in the data chip of FIG. 4 according to an exemplary embodiment of the inventive concept.

Referring to FIG. 15, the scrubbing control circuit 500 includes a counter 505 (e.g., a counter circuit), a scrubbing address generator 510 and a weak codeword address generator 520.

The counter 505 counts the refresh row address REF_ADDR to generate an internal scrubbing signal ISRB which is activated during a first interval when the counter 505 counts the refresh row address REF_ADDR by an interval during which a memory cell row is refreshed. For example, the internal scrubbing signal ISRB may be generated after a certain number of sequential refresh row addresses have been received during a given interval.

The scrubbing address generator 510 generates a normal scrubbing address SCADDR associated with a normal scrubbing operation for codewords in each of the memory cell rows, which gradually changes in a first scrubbing mode, in response to the internal scrubbing signal ISRB and the scrubbing mode signal SMS. For example, the scrubbing address generator 510 may generate a normal scrubbing address SCADDR associated with a normal scrubbing operation for strong codewords.

The normal scrubbing address SCADDR includes a scrubbing row address SRA and a scrubbing column address SCA. The scrubbing row address SRA designates one page in one bank array and the scrubbing column address SCA designates one codeword among a plurality of codewords in the one page. The scrubbing address generator 510 provides the scrubbing row address SRA to a corresponding row decoder and provides the scrubbing column address SCA to a corresponding column decoder.

The scrubbing operation performed based on the normal scrubbing address SCADDR may be referred to as a normal scrubbing operation because the scrubbing operation performed based on the normal scrubbing address SCADDR is performed on all codewords (sub-pages) included in the memory cell array 300.

The weak codeword address generator 520 generates a weak codeword address WCADDR associated with a weak scrubbing operation associated with weak codewords in the bank array in a second scrubbing mode, in response to the internal scrubbing signal ISRB and the scrubbing mode signal SMS. The weak codeword address WCADDR includes a weak codeword row address WCRA and a weak codeword column address WCCA. The scrubbing mode signal SMS indicates the first scrubbing mode when the scrubbing mode signal SMS has a first logic level and indicates the second scrubbing mode when the scrubbing mode signal SMS has a second logic level different from the first logic level. The scrubbing mode signal SMS may be included in the third control signal CTL3. The weak codeword address generator 520 provides the weak codeword row address WCRA to a corresponding row decoder and provides the weak codeword column address WCCA to a corresponding column decoder. In an exemplary embodiment, the ECC decoder 150 is more likely to be able to successfully correct errors in a strong codeword as opposed to a weak codeword. In an exemplary embodiment, weak and strong codewords have a data and redundancy portions (e.g., parity), but the redundancy portion of the strong codeword is larger than the redundancy portion of the weak codeword when these codewords are the same size.

The weak codeword address generator 520 may include an address storing table therein and the address storing table may store address information (e.g., corresponding addresses) of codewords associated with the victim address VCT_ADDR.

The scrubbing operation performed based on the weak codeword address WCADDR may be referred to as a target (or, weak) scrubbing operation because the scrubbing operation performed based on the weak codeword address WCADDR is performed on weak codewords included in the memory cell array 300.

Figure 16:
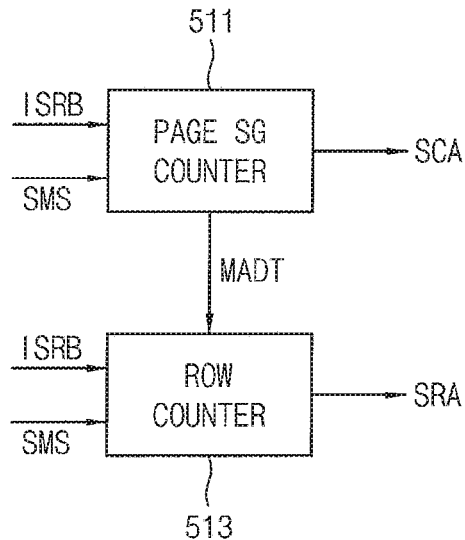
FIG. 16 is a block diagram illustrating a scrubbing address generator in the scrubbing control circuit of FIG. 15 according to an exemplary embodiment of the inventive concept.

FIG. 16 is a block diagram illustrating the scrubbing address generator in the scrubbing control circuit of FIG. 15 according to an exemplary embodiment of the inventive concept.

Referring to FIG. 16, the scrubbing address generator 510 includes a page segment counter 511 and a row counter 513.

The page segment counter 511 increases the scrubbing column address SCA by one while the internal scrubbing signal ISRB is activated in the first scrubbing mode and activates a maximum address detection signal MADT with being reset whenever the scrubbing column address SCA reaches its maximum value, in response to the internal scrubbing signal ISRB and the scrubbing mode signal SMS. The page segment counter 511 provides the maximum address detection signal MADT to the row counter 513.

The row counter 513 starts a counting operation upon receiving the internal scrubbing signal ISRB initially and increases the scrubbing row address SRA by one whenever the activated maximum address detection signal MADT is received in response to the internal scrubbing signal ISRB and the scrubbing mode signal SMS. Since the internal scrubbing signal ISRB is activated during the first interval while a refresh operation is performed on one memory cell row, the page segment counter 511 may generate the scrubbing column address SCA associated with codewords in one page during the first interval.

Figure 17:
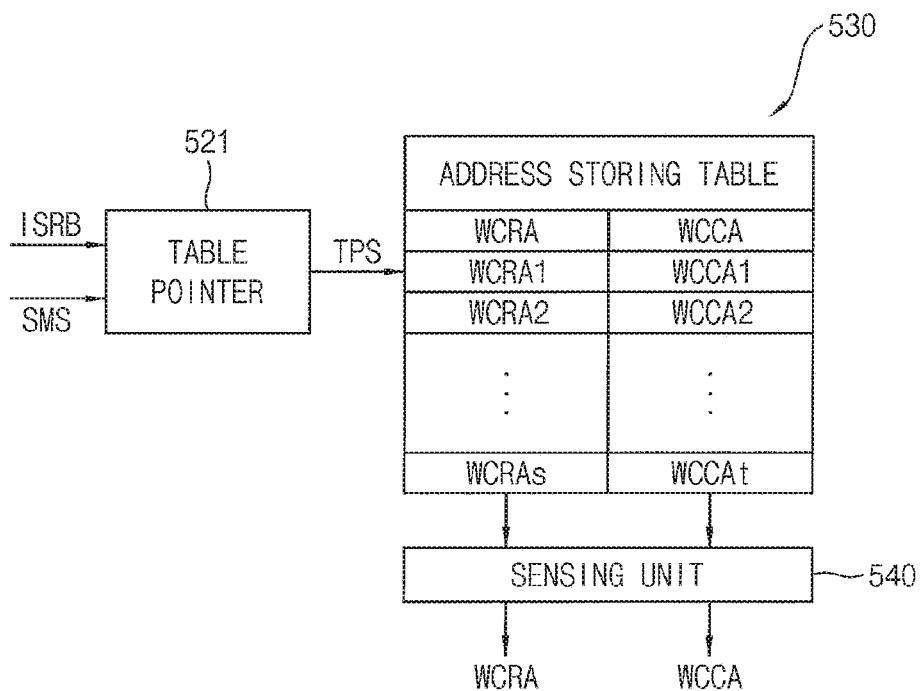
FIG. 17 illustrates a weak codeword address generator in the scrubbing control circuit of FIG. 15 according to an exemplary embodiment of the inventive concept.

FIG. 17 illustrates the weak codeword address generator in the scrubbing control circuit of FIG. 15 according to an exemplary embodiment of the inventive concept.

Referring to FIG. 17, the weak codeword address generator 520 includes a table pointer 521, an address storing table 530 and a sensing unit 540.

The address storing table 530 stores address information WCRA1~WCRAs (s is a natural number greater than 1) and WCCA1~WCCAt (t is a natural number greater than 1) of weak codewords included in the memory cell array 300.

The address information WCRA1~WCRAs is designated as the weak codeword row addresses and address information WCCA1~WCCAt is designated as the weak codeword column addresses. The weak codewords may be all or some of a weak page including a number of bit errors greater than a reference value among pages in the first bank array 310. In addition, the weak codewords may be codewords of neighbor pages adjacent to an intensively accessed memory region. Accordingly, it will be understood that the address storing table 530 may store address information associated with the weak codewords, for example address information that indicates corresponding addresses (e.g., WCRA1~WCRAs and/or WCCA1~WCCAt) of the weak codewords.

The table pointer 521 may generate a pointer signal TPS which provides location information associated with the address storing table 530 in response to the internal scrubbing signal ISRB and the scrubbing mode signal SMS during the first interval in the second scrubbing mode, and provide the pointer signal TPS to the address storing table 530. The address storing table 530 may include a nonvolatile storage. At least one of first and second victim addresses VCT_ADDR1 and VCT_ADDR2 provided from the victim address generator 560 in FIG. 4 may be stored in the address storing table 530.

The pointer signal TPS gradually increases by a predetermined time period during the first interval and the address storing table 530 may output the weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. For example, the pointer signal TPS may include a value that references one of the rows of the address storing table 530, and this value may be adjusted by the table pointer 531 to reference to a different one of the rows. The sensing unit 540 provides the weak codeword row address WCRA to a corresponding row decoder and provides the weak codeword column address WCCA to a corresponding column decoder.

Figures 18, 19:
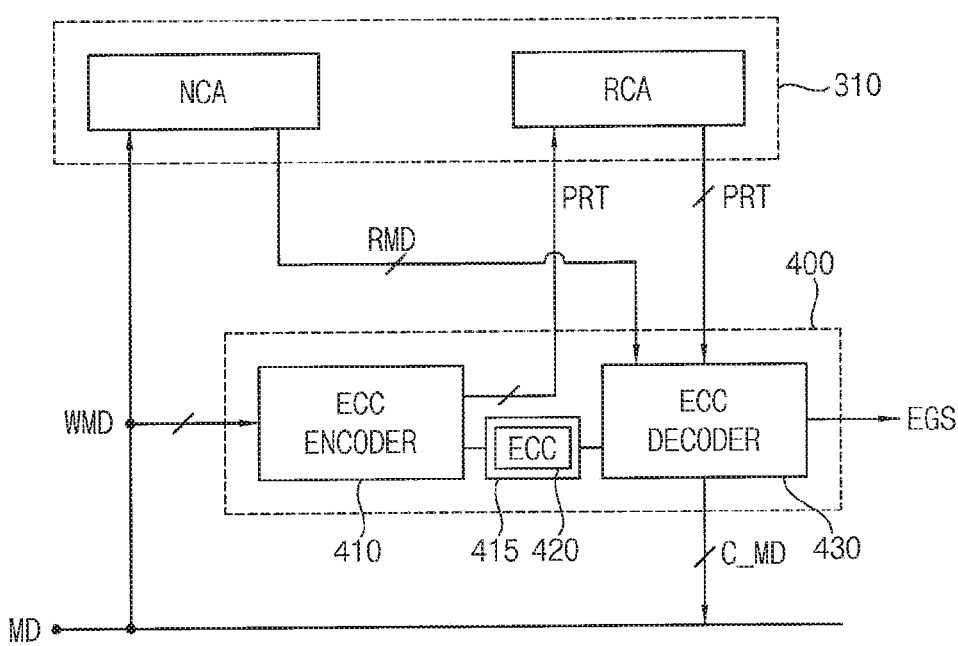
FIG. 18 illustrates an error information register in a data chip of FIG. 4 according to an exemplary embodiment of the inventive concept.
FIG. 19 is a block diagram illustrating an ECC engine in a data chip of FIG. 4 according to an exemplary embodiment of the inventive concept.

FIG. 18 illustrates the error information register in the data chip of FIG. 4 according to an exemplary embodiment of the inventive concept.

Referring to FIG. 18, each of indexes (e.g., entries) Idx1, Indx2, . . . , Idxu (u is a natural number greater than two) may include page error information on each of some pages of memory cell array 300. Each entry may correspond to one of the pages. The error information register 580 includes a plurality of columns 581, 582, 583 and 584.

The second column 581 stores address information ADDINF of each of the some pages. In some exemplary embodiments, the address information ADDINF includes at least one of a bank group address ('BGA'), a bank address ('BA'), and a row address ('RA'). While FIG. 4 illustrated a single group of bank arrays (e.g., 310-380), additional groups of bank arrays may be present. The bank group address may identify one of these groups. For example, if there is a first group of bank arrays including bank arrays 310-380 and a second group of bank arrays, and the errors are occurring in the first group, the BGA would identify the first group. The bank address may identify one of the banks of the identified group. The row address may identify a page of the one bank.

The second column 582 stores a number of error occurrences ECNT of each of the some pages. For example, the error information register 580 of FIG. 18 illustrates the number of error occurrences ECNT for a page having address A is 2, the number of error occurrences ECNT for a page having address B is 4 and the number of error occurrences ECNT for a page having address X is 1.

The third column 583 stores a number of sub-pages FCWCNT including a bit error, of each of the some pages. For example, if a second page has 4 bit errors (ECNT=4), the second page has 64 sub-pages, but only 3 of the 64 sub-pages have bit errors (e.g., sub-pages 1 and 12 each have 1 bit error and sub-page 43 has 2 bit errors), the entry of the second page would have a FCWCNT of 3.

The fourth column 584 stores a row fault flag RFF of each of the some pages. The row fault flag RFF may indicate whether each of the some pages has the row fault. The row fault flag RFF may indicate whether each of the some pages includes K or more codewords and each of the K or more codewords have a bit error.

FIG. 19 is a block diagram illustrating the ECC engine in the data chip of FIG. 4 according to an exemplary embodiment of the inventive concept.

Referring to FIG. 19, the ECC engine 400 includes an ECC encoder 410, an ECC decoder 430 and a memory 415. The memory 415 may store an ECC 420. The ECC may be a single error correction (SEC) code or a single error correction and double error detection (SECDED) code.

The ECC encoder 410 may generate a (third) parity data PRT associated with a write data WMD to be stored in a normal cell array NCA of the first bank array 310 using the ECC 420. For example, the ECC encoder 410 may perform an ECC encoding operation on the write data WMD and the ECC 420 to generate the parity data PRT. The parity data PRT may be stored in a redundancy cell array RCA of the first bank array 310.

The ECC decoder 430 may perform an ECC decoding on read data RMD based on read data RMD and the parity data PRT read from the first bank array 310 by using the ECC 420. When the read data RMD includes at least one bit error as a result of the ECC decoding, the ECC decoder 430 provides the error generation signal EGS to the control logic circuit 210, selectively corrects the bit error in the read data RMD in the scrubbing operation, and outputs a corrected main data C_MD in a read operation. The main data MD may correspond to the user data DQ_BL.

Figure 20:
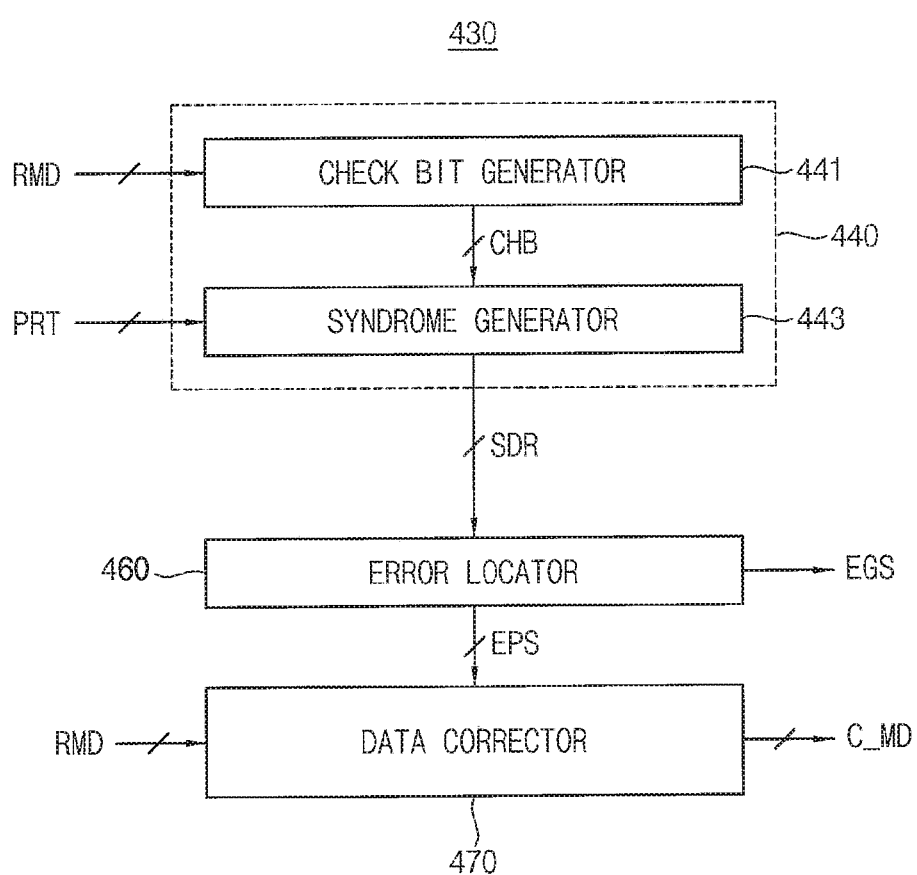
FIG. 20 illustrates an ECC decoder in the ECC engine of FIG. 19 according to exemplary embodiment of the inventive concept.

FIG. 20 illustrates the ECC decoder in the ECC engine of FIG. 19 according to an exemplary embodiment of the inventive concept.

Referring to FIG. 20, the ECC decoder 430 includes a syndrome generation circuit 440, an error locator 460 and a data corrector 470. The syndrome generation circuit 440 includes a check bit generator 441 and a syndrome generator 443.

The check bit generator 441 generates check bits CHB based on the read data RMD by performing an XOR array operation and the syndrome generator 443 generates a syndrome SDR by comparing corresponding bits of the parity data PRT and the check bits CHB.

The error locator 460 generates an error position signal EPS indicating a position of a bit error in the read data RMD and provides the error position signal EPS to the data corrector 470 when all bits of the syndrome SDR are not 'zero'. In addition, when the read data RMD includes the bit error, the error locator 460 provides the error generation signal EGS to the control logic circuit 210.

The data corrector 470 receives the read data RMD, corrects the bit error in the read data RMD based on the error position signal EPS when the read data RMD includes the bit error to generate corrected main data C_MD and outputs the corrected main data C_MD.

Figure 21:
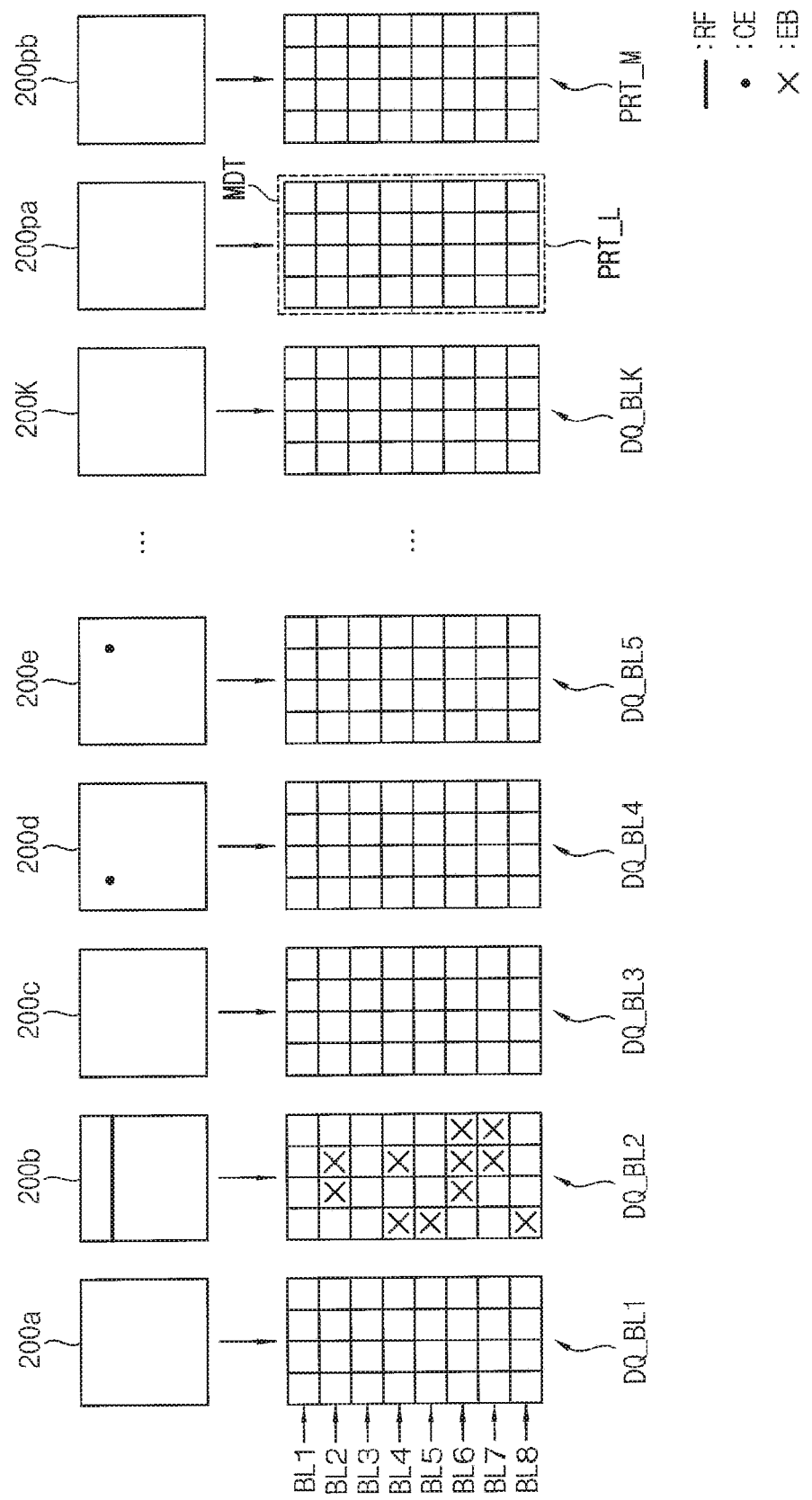
FIG. 21 illustrates an example of a codeword set output from the memory module in FIG. 1.

FIG. 21 illustrates an example of a codeword set output from the memory module in FIG. 1.

In FIG. 21, a row fault RF occurs in a memory cell row of the data chip 200b and each user data output from the data chips 200d and 200e includes a correctable bit error CE.

Referring to FIG. 21, the user data DQ_BL2 includes a plurality of (multiple) bit errors X generated due to the row fault RF occurring in the memory cell row of the data chip 200b. In this case, the first syndrome SDR_L has a zero value and the second syndrome SDR_M has a non-zero value as explained with reference to FIG. 14. Therefore, the ECC decoder 430 cannot correct the bit errors X in the user data DQ_BL2 by using the first syndrome SDR_L and the second syndrome SDR_M. In an exemplary embodiment of the inventive concept, the error information signal EIS corresponding to the data chip 200b includes address information about the positions of the bit errors X. In an exemplary embodiment of the inventive concept, the ECC decoder 430 determines positions of the bit errors X based on the error information signal EIS corresponding to the data chip 200b and may correct the bit errors X by using the second syndrome SDR_M. For example, the ECC decoder 430 may perform a correction operation on the user data DQ_BL2 using the determined positions of the bit errors and the second syndrome SDR_M.

FIGS. 22A through 22D illustrate that the error information signal is transferred between the memory controller and one data chip in the memory system of FIG. 1, respectively.

Figure 22A:
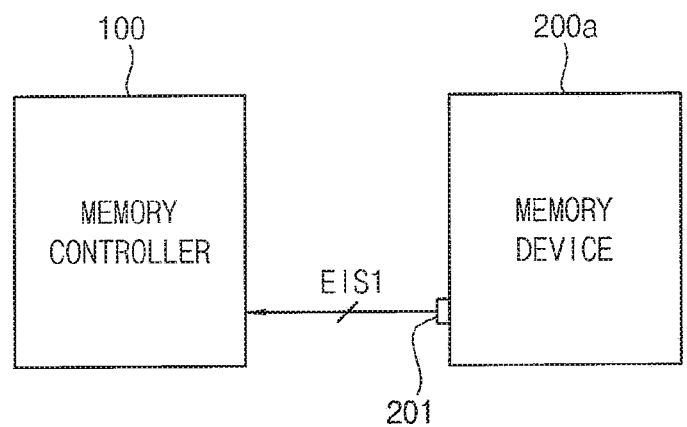
FIGS. 22A through 22D illustrate an error information signal being transferred between the memory controller and one data chip in the memory system of FIG. 1, respectively.

Referring to FIG. 22A, the data chip 200a transmits an error information signal EIS1 to the memory controller 100 through a data mask pin 201 of the data chip 200a in real time. The data mask pin 201 is used when a write operation on the data chip 200a is performed.

Figure 22B:
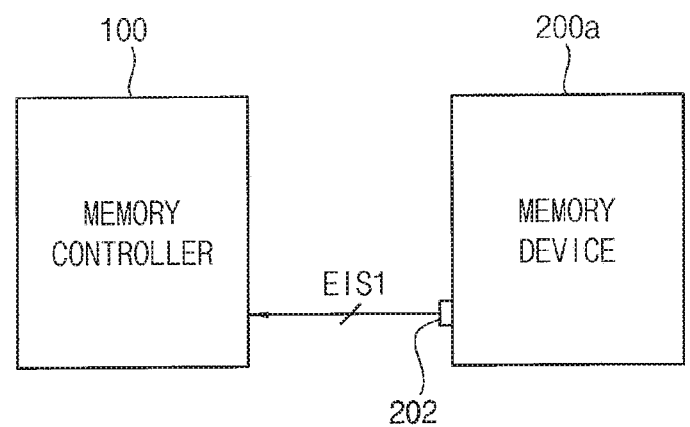

Referring to FIG. 22B, the data chip 200a transmits the error information signal EIS1 to the memory controller 100 through an alert pin 202 of the data chip 200a.

Figure 22C:
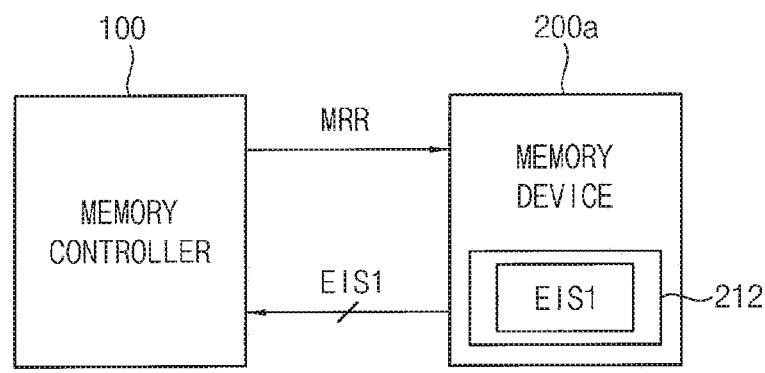

Referring to FIG. 22C, the data chip 200a includes a mode register 212 in the control logic circuit 210, the mode register 212 may store error information, and the memory controller 100 applies a mode register read command MRR to the data chip 200a to receive the error information stored in the mode register 212 as the error information signal EIS1.

Figure 22D:
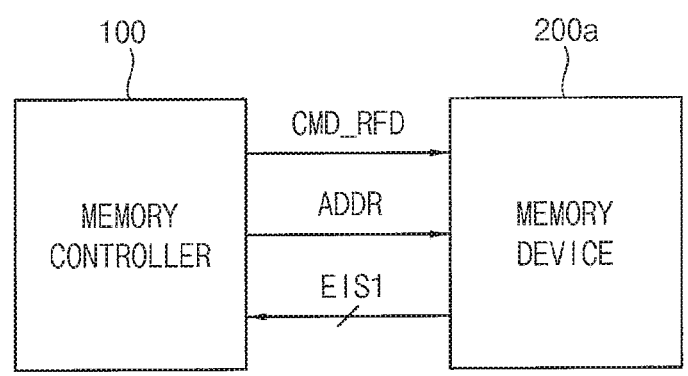

Referring to FIG. 22D, the data chip 200a transmits the error information signal EIS1 to the memory controller 100, the memory controller 100 checks whether the user data set includes bit errors and applies a row fault detection command CMD_RFD and an associated address ADDR to the data chip 200a when the user data set does not include the bit errors, and the address ADDR designates a memory cell row associated with the error information signal EIS1.

Figure 23:
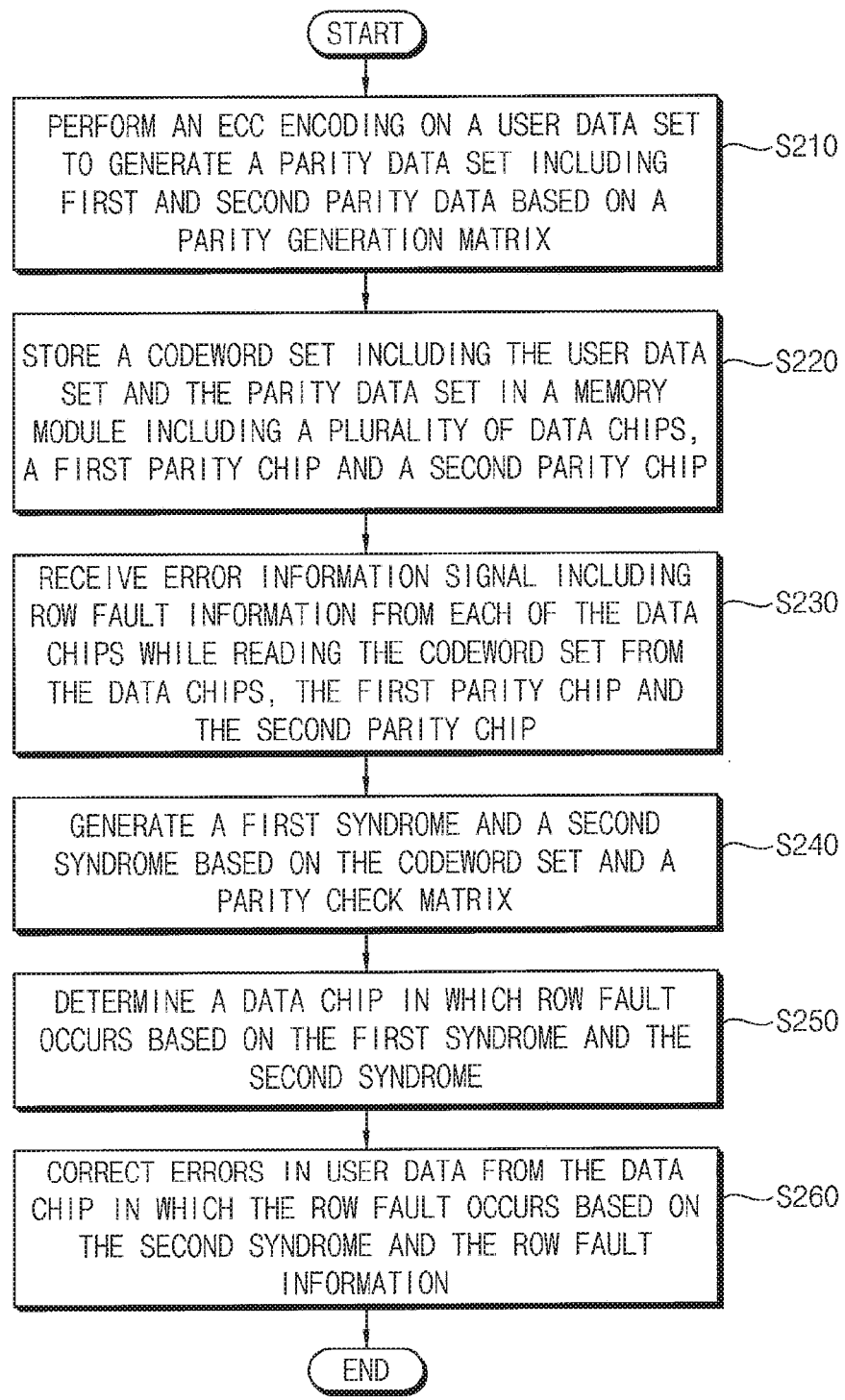
FIG. 23 is a flow chart illustrating a method of operating a memory system including a memory module and a memory controller to control the memory module according to an exemplary embodiment of the inventive concept.

FIG. 23 is a flow chart illustrating a method of operating a memory system including a memory module and a memory controller according to an exemplary embodiment of the inventive concept.

Referring to FIGS. 1 through 23, there is provided a method of operating a memory system 20 that includes a memory module MM and a memory controller 100. The memory module MM includes a plurality of data chips, a first parity chip and a second parity chip. The memory controller 100 controls the memory module MM. According to the method, an ECC encoder 140 of an ECC engine 130 in the memory controller 100 preforms an ECC encoding on a user data set SDQ and a meta data MDT based on a parity generation matrix PGM to generate a parity data set SPRT including a first parity data PRTL and a second parity data PRTM (operation S210). In an exemplary embodiment, the meta data MDT is omitted, and the memory controller 100 preforms an ECC encoding on a user data set SDQ based on a parity generation matrix PGM to generate a parity data set SPRT including a first parity data PRTL and a second parity data PRTM.

The memory controller 100 stores a codeword set SCW1 including the user data set SDQ, the meta data MDT and the parity data set SPRT in the plurality of data chips, the first parity chip and the second parity chip (operation S220). In an exemplary embodiment, the user data set SDQ is stored in one or more of the data chips, the first parity data PRTL is stored in the first parity chip and the second parity data PRTM is stored in the second parity chip.

The memory controller 100 receives an error information signal EIS including row fault information from each of the data chips and reads a codeword set SCW2 including the user data set SDQ, the meta data MDT and the parity data set SPRT from the memory module MM (operation S230). In an exemplary embodiment, the meta data MDT is omitted, and the memory controller 110 reads a codeword set SCW2 including user data set SDQ and the parity data set SPRT from the memory module MM. For example, the user data set SDQ may be read from one or more of the data chips, part of the parity data set SPRT may be read from a first parity chip, the remainder of the parity data set SPRT may be read from a second parity chip, and the read data may be used to generate the codeword set SCW2.

An ECC decoder 150 of the ECC engine 130 generates a first syndrome SDR_L and a second syndrome SDR_M based on the read codeword set SCW2 and a parity check matrix PCM (operation S240).

The ECC decoder 150 determines a data chip in which bit errors, generated by a row fault, included in the user data set of the read codeword set SCW2 occurs based on the first syndrome SDR_L and the second syndrome SDR_M (operation S250).

The ECC decoder 150 corrects the bit errors generated by a row fault, which are included in the user data from a data chip in which the row fault occurs based on the row fault information included in the error information signal EIS and the second syndrome SDR_M (operation S260).

Figure 24:
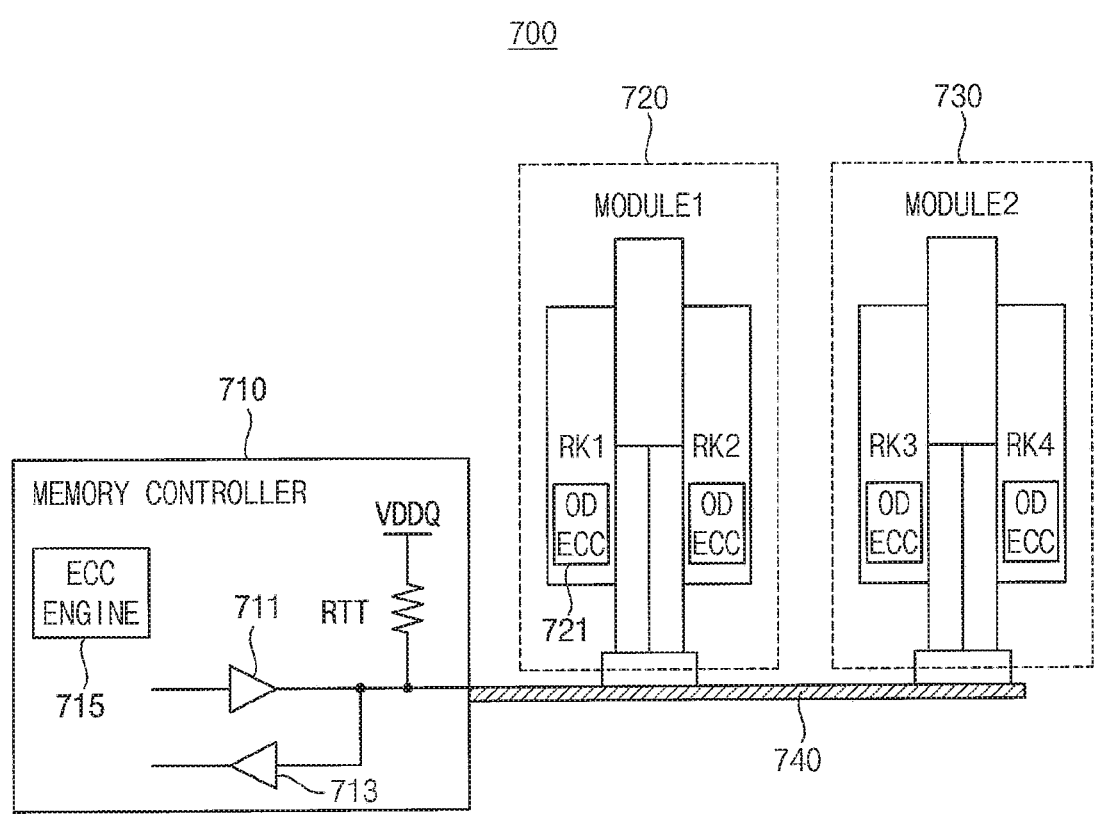
FIG. 24 is a block diagram illustrating a memory system having quad-rank memory modules according to an exemplary embodiment of the inventive concept.

FIG. 24 is a block diagram illustrating a memory system having quad-rank memory modules according to an exemplary embodiment of the inventive concept.

Referring to FIG. 24, a memory system 700 includes a memory controller 710 and at least one or more memory modules 720 and 730.

The memory controller 710 may control a memory module 720 and/or 730 so as to perform a command supplied from a processor or host. The memory controller 710 may be implemented in a processor or a host, or may be implemented within an application processor or a system-on-a-chip (SoC).

For signal integrity, a source termination may be implemented with a resistor RTT on a bus 740 of the memory controller 710. The resistor RTT may be coupled to a power supply voltage VDDQ. The memory controller 710 may include a transmitter 711, to transmit a signal to one or more of the memory modules 720 and 730, and a receiver 713 to receive a signal from one or more of the memory modules 720 and 730. The memory controller 710 includes an ECC engine 715 that may employ the ECC engine 130 of FIG. 6.

Therefore, the ECC engine 715 includes an ECC encoder and an ECC decoder and the ECC decoder may correct multiple bit errors in a codeword set read from one or more of the memory modules 720 and 730, which are uncorrectable based on the syndrome, by using error information signals.

The memory modules 720 and 730 may be referred to as a first memory module 720 and a second memory module 730. The first memory module 720 and the second memory module 730 may be coupled to the memory controller 710 through the bus 740. Each of the first memory module 720 and the second memory modules 730 may correspond to the memory module MM in FIG. 1. The first memory module 720 may include at least one or more memory ranks RK1 and RK2, and the second memory module 730 may include one or more memory ranks RK3 and RK4.

Each of the first memory module 720 and the second memory module 730 may include a plurality of data chips, a first parity chip and a second parity chip and each of the data chips may include an on-die ECC engine 721. The on-die ECC engine 721 may detect a row fault during a scrubbing operation.

Figure 25:
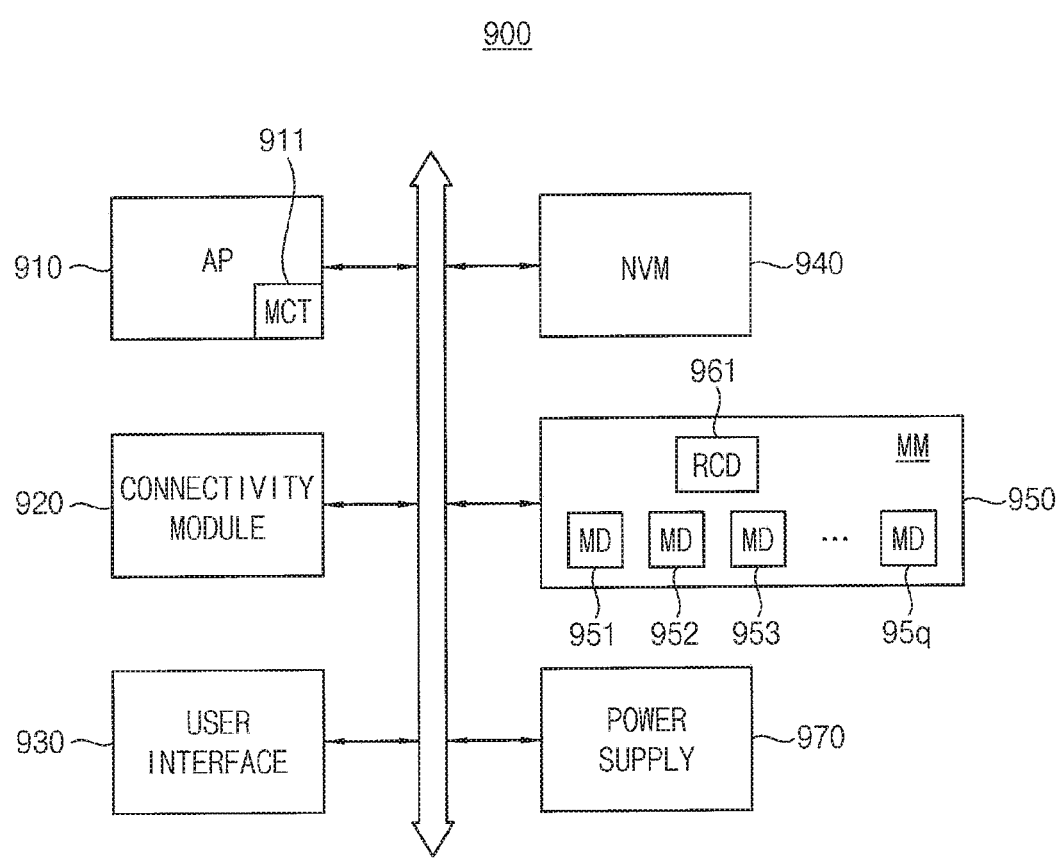
FIG. 25 is a block diagram illustrating a mobile system including a memory module according to an exemplary embodiment of the inventive concept.

FIG. 25 is a block diagram illustrating a mobile system including a memory module according to an exemplary embodiment of the inventive concept.

Referring to FIG. 25, a mobile system 900 includes an application processor 910, a connectivity module 920, a memory module 950, a nonvolatile memory device 940, a user interface 930, and a power supply 970. The application processor 910 may include a memory controller (MCT) 911.

The application processor 910 may execute applications, such as a web browser, a game application, a video player, etc. The connectivity module 920 may perform wired or wireless communication with an external device. For example, the connectivity module 920 could be implemented by a modem or a network card.

The memory module (MM) 950 may store data processed by the application processor 910 or operate as a working memory. The memory module 950 may include a plurality of semiconductor memory devices (MD) 951, 952, 953, and 95$q$ (where q is a positive integer greater than three), and a control device (RCD) 961.

The semiconductor memory devices 951, 952, 953, and 95$q$ may include a plurality of data chips, a first parity chip and a second parity chip. Therefore, the memory controller 911 may correct multiple bit errors in a codeword set read from the memory module 950, which are uncorrectable based on the syndrome, by using error information signals.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

The mobile system 900 or components of the mobile system 900 may be mounted using various types of packages.

Exemplary embodiments of the inventive concept may be applied to various systems including a memory module and a memory controller that includes an ECC engine.

While the present disclosure has been particularly shown and described with reference to the exemplary embodiments thereof, it will be understood by those of ordinary skill in the art that various changes in form and detail may be made therein without departing from the spirit and scope of the present disclosure.

What is claimed is:

1. A memory controller configured to control a memory module including a plurality of data chips, the memory controller comprising:
an error correction code (ECC) engine; and
a central processing unit (CPU) configured to control the ECC engine, wherein the ECC engine comprises:
an ECC decoder; and
a memory configured to store a parity check matrix, wherein the ECC decoder is configured to:
receive error information signals from the plurality of data chips respectively, each of the error information signals including row fault information indicating whether a row fault occurs in at least one memory cell row of a corresponding one of the data chips;
identify at least one of the data chips in which the row fault occurs based on the error information signals;
perform an ECC decoding on a read codeword set read from the at least one memory cell row using the parity check matrix to generate a first syndrome indicating positions of bit errors and a second syndrome indicating a number of bit errors; and
correct a plurality of bit errors in a user data set of the read codeword set based on address information of the error information signals identifying the at least one of the data chips in which the row fault occurs and the second syndrome when the bit errors are not correctable using the first and second syndromes and the row fault information indicates the row fault has occurred.

2. The memory controller of claim 1, wherein the ECC decoder is configured to determine that the row fault occurs in response to the first syndrome having a zero value and the second syndrome having a non-zero value.

3. The memory controller of claim 2, wherein
when the user data set is checked and does not include bit errors corresponding to the row fault in response to the ECC decoder determining that the row fault occurs,
the CPU is configured to transmit a row fault detection command and an associated address to a data chip in which the row fault occurs.

4. The memory controller of claim 1, wherein the ECC decoder is configured to receive the error information signals through a data mask pin of each of the data chips.

5. The memory controller of claim 1, wherein the ECC decoder is configured to receive the error information signals through an alert pin of each of the data chips.

6. The memory controller of claim 1, wherein:
the read codeword set further includes metadata associated with the user data set, first parity data associated with locations of bit errors in the user data set, and second parity data associated with a quantity of the bit errors;
the user data set is read from the plurality of data chips, the meta data and the first parity data are read from a first parity chip of the memory module and the second parity data is read from a second parity chip of the memory module; and
the parity check matrix includes a first parity sub matrix, a second parity sub matrix and a third parity sub matrix.

7. The memory controller of claim 6, wherein the ECC decoder is configured to:
generate the first syndrome by performing a matrix-multiplication operation on the read codeword set and the first parity sub matrix; and
generate the second syndrome by performing a matrix-multiplication operation on the read codeword set and the second sub parity matrix and the third parity sub matrix.

8. A memory system comprising:
a memory module including a plurality of data chips; and
a memory controller configured to control the memory module,
wherein the memory controller includes:
a first error correction code (ECC) engine; and
a central processing unit (CPU) configured to control the first ECC engine,
wherein the first ECC engine includes:
an ECC decoder; and
a memory configured to store a parity check matrix, wherein the ECC decoder is configured to:
receive error information signals from the plurality of data chips respectively, each of the error information signals including row fault information indicating whether a row fault occurs in at least one page of a corresponding one of the data chips;
identify at least one of the data chips in which the row fault occurs based on the error information signals;
perform an ECC decoding on a read codeword set read from the at least one page using the parity check matrix to generate a first syndrome indicating positions of bit errors and a second syndrome indicating a number of bit errors; and
correct a plurality of bit errors in a user data set of the read codeword set based on address information of the error information signals identifying the at least one of the data chips in which the row fault occurs and the second syndrome when the bit errors are not correctable using the first and second syndromes and the row fault information indicates the row fault has occurred.

9. The memory system of claim 8, wherein
the ECC decoder is configured to determine that the row fault occurs in response to the first syndrome having a zero value and the second syndrome having a non-zero value.

10. The memory system of claim 8, wherein
the read codeword set further includes metadata associated with the user data set, a first parity data associated with locations of bit errors in the user data set, and second parity data associated with a quantity of the bit errors;
the user data set is read from the plurality of data chips, the meta data and the first parity data are read from a first parity chip of the memory module and the second parity data is read from a second parity chip of the memory module;
the parity check matrix includes a first parity sub matrix, a second parity sub matrix and a third parity sub matrix; and
wherein the ECC decoder is configured to:
generate the first syndrome by performing matrix-multiplication operation on the read codeword set and the first parity sub matrix; and
generate the second syndrome by performing matrix-multiplication operation on the read codeword set and the second sub parity matrix and the third parity sub matrix.

11. The memory system of claim 8, wherein each of the plurality of data chips includes:
a memory cell array including a plurality of memory cell rows, each of the plurality of memory cell rows including a plurality of volatile memory cells;
a second ECC engine;
an error information register;
a scrubbing control circuit configured to generate scrubbing addresses that designate a first memory cell row on which a scrubbing operation is to be performed among from the plurality of memory cell rows during a refresh operation on the plurality of memory cell rows; and
a control logic circuit configured to control the second ECC engine and the scrubbing control circuit based on a command and an address from the memory controller,
wherein the control logic circuit is configured to determine that the row fault occurs in a first memory cell row among the memory cell rows in response to a bit error being detected in K codewords from among M codewords of the first memory cell row during the scrubbing operation on the first memory cell row and is configured to transmit the error information signal including the row fault information to the memory controller,
wherein K is an integer greater than two and M is an integer greater than 3.

12. The memory system of claim 11, wherein:
the control logic circuit is configured to control the second ECC engine such that the second ECC engine sequentially reads data corresponding to the codeword, from M sub-pages in the first memory cell row, and performs an error detection operation on the codeword to generate an error generation signal, and the control logic circuit is configured to record error information in the error information register and the error information includes an error occurrence count in the each of the codewords.

13. The memory system of claim 12, wherein the control logic circuit is configured to control the second ECC engine based on the error information such that the second ECC engine writes back correctable codewords in corresponding memory locations, respectively, in response to a number of the correctable codewords of the M codewords being smaller than K, and each of the correctable codewords including a bit error to be corrected by the second ECC engine.

14. The memory system of claim 11, wherein the scrubbing control circuit is configured to count refresh row addresses for refreshing the memory cell rows to output the scrubbing addresses whenever the scrubbing control circuit counts N refresh row addresses of the refresh row addresses, and N is an integer greater than two.

15. The memory system of claim 14, wherein the scrubbing control circuit comprises:
a counter configured to count the refresh row addresses to generate an internal scrubbing signal, wherein the counter activates the internal scrubbing signal whenever the counter counts the M refresh row addresses of the refresh row addresses; and
a scrubbing address generator configured to generate a normal scrubbing address associated with a normal scrubbing operation for the first memory cell row, in response to the internal scrubbing signal,
wherein the normal scrubbing address includes a scrubbing row address designating one of the memory cell rows and a scrubbing column address designating one of codewords included in the one memory cell row, and
wherein the scrubbing address generator comprises:
a page segment counter configured to increase the scrubbing column address by one during a period which the internal scrubbing signal is activated; and
a row counter configured to increase the scrubbing column address by one whenever the scrubbing column address reaches a maximum value.

16. The memory system of claim 8, wherein each of the data chips is configured to transmit the error information signal to the memory controller through a data mask pin of a respective one of the data chips.

17. The memory system of claim 8, wherein each of the data chips is configured to transmit the error information signal to the memory controller through an alert pin of a respective one of the data chips.

18. The memory system of claim 8, wherein
the control logic circuit in each of the data chips includes a mode register,
the mode register stores a corresponding one of the error information signals and
the mode register is configured to provide the memory controller with the corresponding one of the error information signals in response to a mode register read command from the memory controller.

19. The memory system of claim 8, wherein:
the ECC decoder is configured to determine that the row fault occurs in response to the first syndrome having a zero value and the second syndrome having a non-zero value;
when the user data set is checked and does not include bit errors corresponding to the row fault in response to the ECC decoder determining that the row fault occurs in at least one of the data chips, the memory controller is configured to transmit a row fault detection command and an associated address to a data chip in which the row fault occurs; and the data chip in which the row fault occurs, is configured to perform an error detection operation on a memory cell row designated by the associated address in response to the row fault detection command and the associated address.

20. A memory system comprising:

a memory module including a plurality of data chips; and a memory controller configured to control the memory module, wherein the memory controller includes:

an error correction code (ECC) engine; and a central processing unit (CPU) configured to control the ECC engine, wherein the ECC engine includes:

an ECC decoder; and a memory configured to store a parity check matrix, wherein the ECC decoder is configured to:

receive error information signals from the plurality of data chips respectively, each of the error information signals including row fault information indicating whether a row fault occurs in at least one memory cell row of a corresponding one of the data chips;

identify at least one of the data chips in which the row fault occurs based on the error information signals;

perform an ECC decoding on a read codeword set read from the least one memory cell row using the parity check matrix to generate a first syndrome indicating positions of bit errors and a second syndrome indicating a number of bit errors; and correct a plurality of bit errors in a user data set of the read codeword set based on address information of the error information signals identifying the at least one of the data chips in which the row fault occurs and the second syndrome when the first syndrome has a zero value, the second syndrome has a non-zero value, and the row fault information indicates the row fault has occurred.

* * * * *